(12) United States Patent
Koroku et al.

(10) Patent No.: US 8,154,133 B2
(45) Date of Patent: Apr. 10, 2012

(54) SEMICONDUCTOR DEVICE HAVING LOW DIELECTRIC CONSTANT FILM AND MANUFACTURING METHOD THEREOF

(75) Inventors: Taisuke Koroku, Sagamihara (JP); Takeshi Wakabayashi, Sayama (JP); Osamu Okada, Hamura (JP); Osamu Kuwabara, Tokyo (JP); Junji Shiota, Hamura (JP); Nobumitsu Fujii, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 176 days.

(21) Appl. No.: 12/412,576

(22) Filed: Mar. 27, 2009

(65) Prior Publication Data
US 2009/0243097 A1    Oct. 1, 2009

(30) Foreign Application Priority Data

Mar. 31, 2008  (JP) .................. 2008-089674
Sep. 2, 2008  (JP) .................. 2008-224341

(51) Int. Cl.
*H01L 23/48* (2006.01)
*H01L 23/52* (2006.01)
*H01L 29/40* (2006.01)

(52) U.S. Cl. ................. 257/774; 257/E23.011
(58) Field of Classification Search ............ 257/774, 257/738, 773, E23.011
See application file for complete search history.

(56) References Cited

U.S. PATENT DOCUMENTS

| | | | |
|---|---|---|---|
| 6,274,514 B1 | 8/2001 | Jang et al. | |
| 6,476,491 B2 | 11/2002 | Harada et al. | |
| 6,559,548 B1 | 5/2003 | Matsunaga et al. | |
| 6,563,218 B2 | 5/2003 | Matsunaga et al. | |
| 6,579,787 B2 | 6/2003 | Okura et al. | |
| 6,770,971 B2 | 8/2004 | Kouno et al. | |
| 6,989,600 B2 | 1/2006 | Kubo et al. | |
| 7,042,081 B2 | 5/2006 | Wakisaka et al. | |
| 7,064,440 B2 | 6/2006 | Jobetto et al. | |
| 7,075,181 B2 * | 7/2006 | Wakabayashi et al. | ....... 257/734 |
| 7,176,572 B2 | 2/2007 | Hanaoka | |
| 7,256,496 B2 | 8/2007 | Okada et al. | |
| 7,294,922 B2 | 11/2007 | Jobetto et al. | |

(Continued)

FOREIGN PATENT DOCUMENTS

EP        1 298 725 A      4/2003

(Continued)

OTHER PUBLICATIONS

Japanese Office Action dated May 25, 2010 and English translation thereof, issued in counterpart Japanese Application No. 2008-224341.

(Continued)

*Primary Examiner* — Jenny L Wagner
(74) *Attorney, Agent, or Firm* — Holtz, Holtz, Goodman & Chick, PC

(57) ABSTRACT

A low dielectric constant film/wiring line stack structure made up of a stack of low dielectric constant films and wiring lines is provided in a region on the upper surface of the semiconductor substrate except for the peripheral part of this surface. The peripheral side surface of the low dielectric constant film/wiring line stack structure is covered with a sealing film. This provides a structure in which the low dielectric constant films do not easily come off. In this case, a lower protective film is provided on the lower surface of a silicon substrate to protect this lower surface against cracks.

10 Claims, 29 Drawing Sheets

U.S. PATENT DOCUMENTS

| | | |
|---|---|---|
| 7,294,933 B2 | 11/2007 | Hanaoka |
| 7,407,879 B2 | 8/2008 | Nicholson et al. |
| 7,547,967 B2 | 6/2009 | Jobetto et al. |
| 7,602,779 B2 | 10/2009 | Kato et al. |
| 7,618,886 B2 | 11/2009 | Jobetto et al. |
| 7,816,790 B2 * | 10/2010 | Mizusawa et al. ............ 257/758 |
| 2002/0024145 A1 | 2/2002 | Okura et al. |
| 2002/0100984 A1 | 8/2002 | Oshima et al. |
| 2003/0148558 A1 | 8/2003 | Kubo et al. |
| 2005/0170641 A1 | 8/2005 | Kondo et al. |
| 2006/0012039 A1 | 1/2006 | Kim et al. |
| 2006/0060984 A1 | 3/2006 | Wakabayashi et al. |
| 2006/0166012 A1 | 7/2006 | Nicholson et al. |
| 2006/0186542 A1 | 8/2006 | Wakabayashi et al. |
| 2006/0273463 A1 | 12/2006 | Wakabayashi et al. |
| 2006/0291029 A1 | 12/2006 | Lin et al. |
| 2007/0267743 A1 | 11/2007 | Mizusawa et al. |
| 2009/0079072 A1 | 3/2009 | Mizusawa et al. |
| 2009/0079073 A1 | 3/2009 | Mizusawa et al. |

FOREIGN PATENT DOCUMENTS

| | | |
|---|---|---|
| EP | 1 737 037 A | 12/2006 |
| JP | 59-222954 A | 12/1984 |
| JP | 10-032220 A | 2/1998 |
| JP | 11-214434 A | 8/1999 |
| JP | 2002-217198 A | 8/2002 |
| JP | 2003-298005 A | 10/2003 |
| JP | 2004-79928 A | 3/2004 |
| JP | 2004-158827 A | 6/2004 |
| JP | 2004-165658 A | 6/2004 |
| JP | 2004-349461 A | 12/2004 |
| JP | 2005-175317 A | 6/2005 |
| JP | 2005-347461 A | 12/2005 |
| JP | 2006-100535 A | 4/2006 |
| JP | 2006-352706 A | 12/2006 |
| JP | 2007-335830 A | 12/2007 |
| TW | 200405496 | 4/2004 |
| TW | 200614404 A | 5/2006 |
| WO | WO 2005/024912 A2 | 3/2005 |
| WO | WO 2006/129832 A1 | 12/2006 |

OTHER PUBLICATIONS

Japanese Office Action dated Aug. 31, 2010 (and English translation thereof) in counterpart Japanese Application No. 2008-224341.

Chinese Office Action dated Jul. 9, 2010 (and English translation thereof) in counterpart Chinese Application No. 200910132909.1.

Korean Office Action dated Nov. 12, 2010 (and English translation thereof) in counterpart Korean Application No. 10-2009-0027020.

Japanese Office Action dated Jun. 17, 2008 and English translation thereof that issued in Japanese Application No. 2006-316643, which is a counterpart of related U.S. Appl. No. 11/638,717.

Japanese Office Action dated Apr. 17, 2007 and English translation thereof that issued in Japanese Application No. 2006-316643, which is a counterpart of related U.S. Appl. No. 11/638,717.

Taiwanese Office Action dated Feb. 26, 2010 and English translation thereof that issued in Taiwanese Application No. 095146789, which is a counterpart of related U.S. Appl. No. 11/638,717.

International Search Report and Written Opinion dated May 4, 2007 (in English) that issued in International Application No. PCT/JP2006/325131, which is an International counterpart of related U.S. Appl. No. 11/638,717.

International Search Report and Written Opinion dated Sep. 10, 2008 (in English) that issued in International Application No. PCT/JP2008/060408, which is an International counterpart of related U.S. Appl. No. 12/001,878.

U.S. Appl. No. 11/638,717; First Named Inventor: Aiko Mizusawa; Title: "Semiconductor Device Having Low Dielectric Insulating Film and Manufacturing Method of the Same"; Filed: Dec. 14, 2006.

U.S. Appl. No. 12/001,878; First Named Inventor: Aiko Mizusawa; Title: "Semiconductor Device Having Low Dielectric Insulating Film and Manufacturing Method of the Same"; Filed: Dec. 13, 2007.

U.S. Appl. No. 12/156,822; First Named Inventor: Taisuke Koroku; Title: "Semiconductor Device Having Low Dielectric Constant Film and Manufacturing Method Thereof"; Filed: Mar. 27, 2009.

* cited by examiner

SEMICONDUCTOR DEVICE HAVING LOW DIELECTRIC CONSTANT FILM AND MANUFACTURING METHOD THEREOF

CROSS-REFERENCE TO RELATED APPLICATIONS

This application is based upon and claims the benefit of priority from prior Japanese Patent Applications No. 2008-089674, filed Mar. 31, 2008; and No. 2008-224341, filed Sep. 2, 2008, the entire contents of both of which are incorporated herein by reference.

BACKGROUND OF THE INVENTION

1. Field of the Invention

This invention relates to a semiconductor device having a low dielectric constant film and a manufacturing method thereof.

2. Description of the Related Art

A chip size package (CSP) having about the same size and dimensions as a semiconductor substrate is known as a semiconductor device mounted on small electronic equipment such as portable electronic equipment. A CSP which has been packaged in a wafer state and diced into semiconductor devices is called a wafer level package (WLP).

Jpn. Pat. Appln. KOKAI Publication No. 2004-349461 has disclosed a semiconductor device, and this semiconductor device comprises: a wiring line extending on the upper surface of an insulating film over a connection pad formed on a semiconductor substrate; a large number of columnar electrodes provided on the upper surface of a connection pad portion formed on one end of the extending wiring line; and a sealing film formed over the wiring line between the columnar electrodes on the upper surface of the insulating film. The sealing film is provided so that its upper surface is flush with the upper surfaces of the columnar electrodes, and solder balls are provided on the upper surfaces of the columnar electrodes.

On the other hand, in some of the semiconductor devices as described above, an interlayer insulating film/wiring line stack structure composed of interlayer insulating films and wiring lines is provided in an integrated circuit formed on one surface of a semiconductor substrate. In this case, if the distance between the wiring lines of the interlayer insulating film/wiring line stack structure is reduced due to miniaturization, the capacity between the wiring lines increases, and a signal transmitted through these wiring lines is more delayed.

A low dielectric constant material called, for example, a low-k material is attracting attention as the material of the interlayer insulating film that makes improvements. This material has a dielectric constant lower than 4.2 to 4.0 which is the dielectric constant of silicon oxide generally used as the material of the interlayer insulating film. The low-k material includes, for example, SiOC which is silicondioxide ($SiO_2$) doped with carbon (C), and SiOCH further containing H. For a further reduction in dielectric constant, a porous low dielectric constant film containing air is also considered.

However, the disadvantage of a semiconductor device having the above-described low dielectric constant film, in particular, the hollow porous low dielectric constant film is that the film is low in mechanical strength, susceptible to water, and apt to come off a foundation layer.

BRIEF SUMMARY OF THE INVENTION

It is therefore an object of this invention to provide a semiconductor device and a manufacturing method thereof enabling significant improvement of a low dielectric constant film that comes off.

A semiconductor device according to this invention comprises: a semiconductor substrate; a low dielectric constant film/wiring line stack structure which is provided in a region on one surface of the semiconductor substrate except for the peripheral part of this surface and which is made up of a stack of low dielectric constant films having a relative dielectric constant of 3.0 or less and wiring lines; and an insulating film provided on the low dielectric constant film/wiring line stack structure. Provided on the insulating film and connected to the wiring line of the low dielectric constant film/wiring line stack structure, and an external connection bump electrode disposed on the electrode connection pad portion. A sealing film made of an organic resin is provided on the peripheral side surfaces of the semiconductor substrate, the low dielectric constant film/wiring line stack structure and the insulating film and on the insulating film around the external connection bump electrode, and a lower protective film made of an organic resin is provided on the lower surface of the semiconductor substrate.

A semiconductor device manufacturing method according to this invention comprises: preparing an assembly, the assembly including a low dielectric constant film/wiring line stack structure which is formed on one surface of a semiconductor wafer and which is made up of a stack of low dielectric constant films having a relative dielectric constant of 3.0 or less and wiring lines, an insulating film formed on the low dielectric constant film/wiring line stack structure except for a region on a dicing street and both neighboring sides thereof, an electrode connection pad portion formed on the insulating film so that this electrode connection pad portion is connected to a connection pad portion of the uppermost wiring line of the low dielectric constant film/wiring line stack structure, and an external connection bump electrode formed on the electrode connection pad portion; removing the low dielectric constant film/wiring line stack structure in the region on the dicing street and both neighboring sides thereof by laser beam application to form a first trench exposing the side surface of the low dielectric constant film/wiring line stack structure and the upper surface of the semiconductor wafer; forming, by a half-cut, a second trench in the center of the semiconductor wafer exposed via the first trench; forming a sealing film made of an organic resin in the first and second trenches and around the external connection bump electrode on the insulating film; grinding the lower side of the semiconductor wafer to reduce the thickness of the semiconductor wafer; forming a lower protective film made of an organic resin on the lower surface of the semiconductor substrate; and cutting the sealing film along the dicing street in the center of the first and second trenches to obtain a plurality of semiconductor devices.

According to this invention, a low dielectric constant film/wiring line stack structure which is made up of a stack of low dielectric constant films having a relative dielectric constant of 3.0 or less and wiring lines is provided in a region on the semiconductor substrate except for its peripheral part. The side surface of this low dielectric constant film/wiring line stack structure is covered with an insulating film, thereby enabling significant improvement of the low dielectric constant film that comes off. In this case, a lower protective film made of an organic resin is provided on the lower surface of the semiconductor substrate in order to protect the lower surface of the semiconductor substrate against cracks.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

Figure 2:
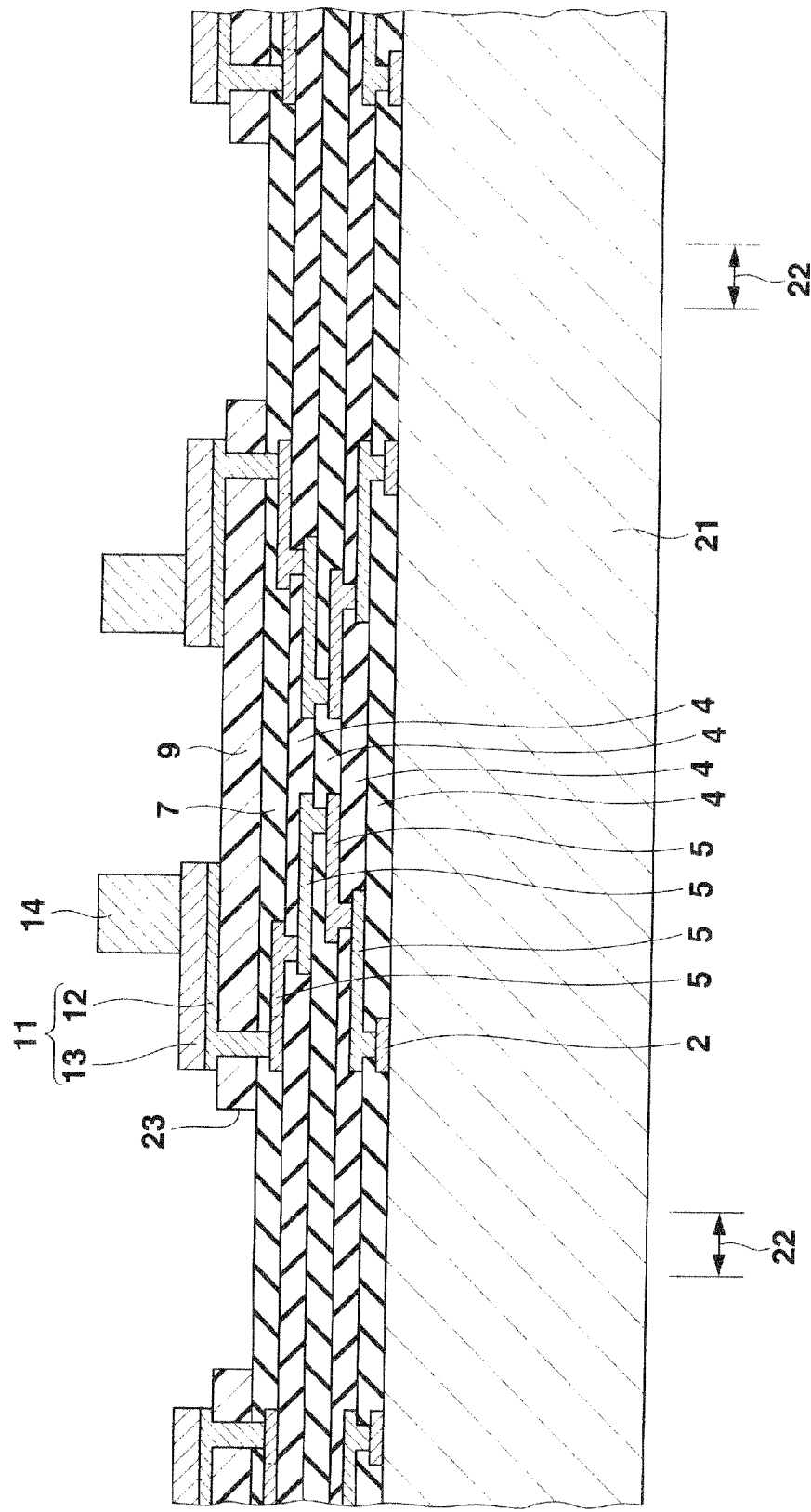
FIG. 2 is a sectional view of an initially prepared assembly in one example of a method of manufacturing the semiconductor device shown in FIG. 1.
Figure 3:
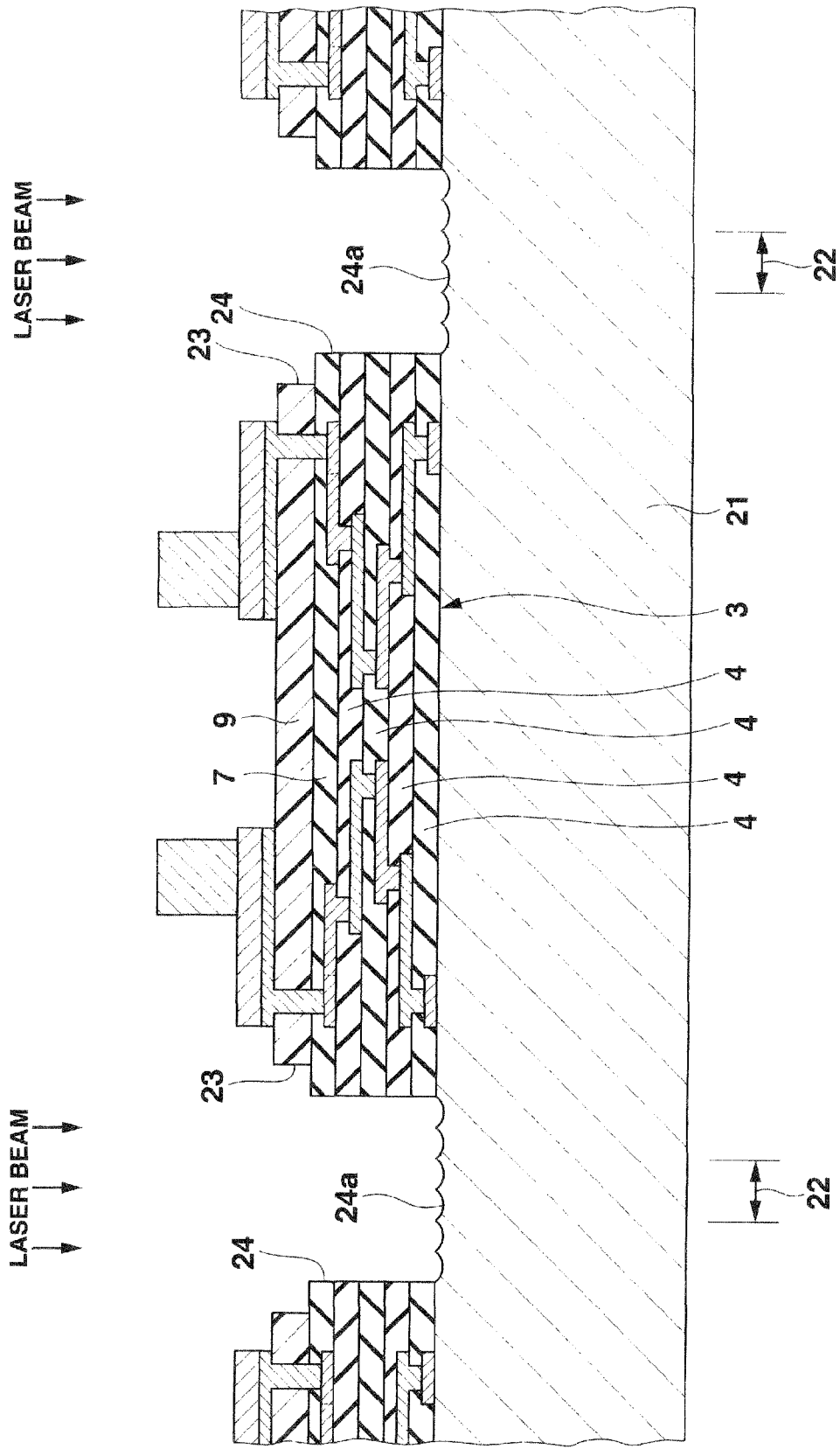
Figure 4:
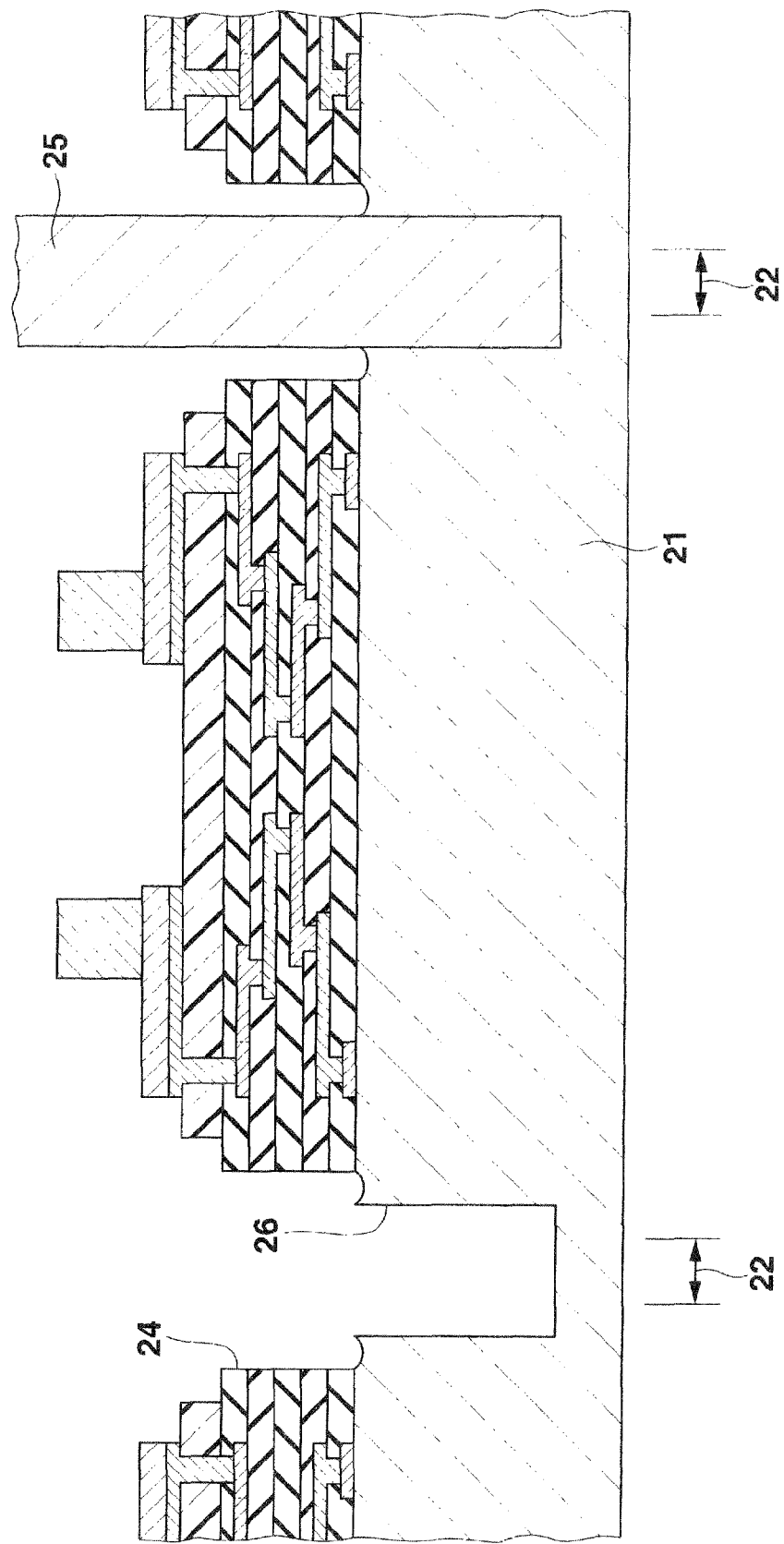
Figure 5:
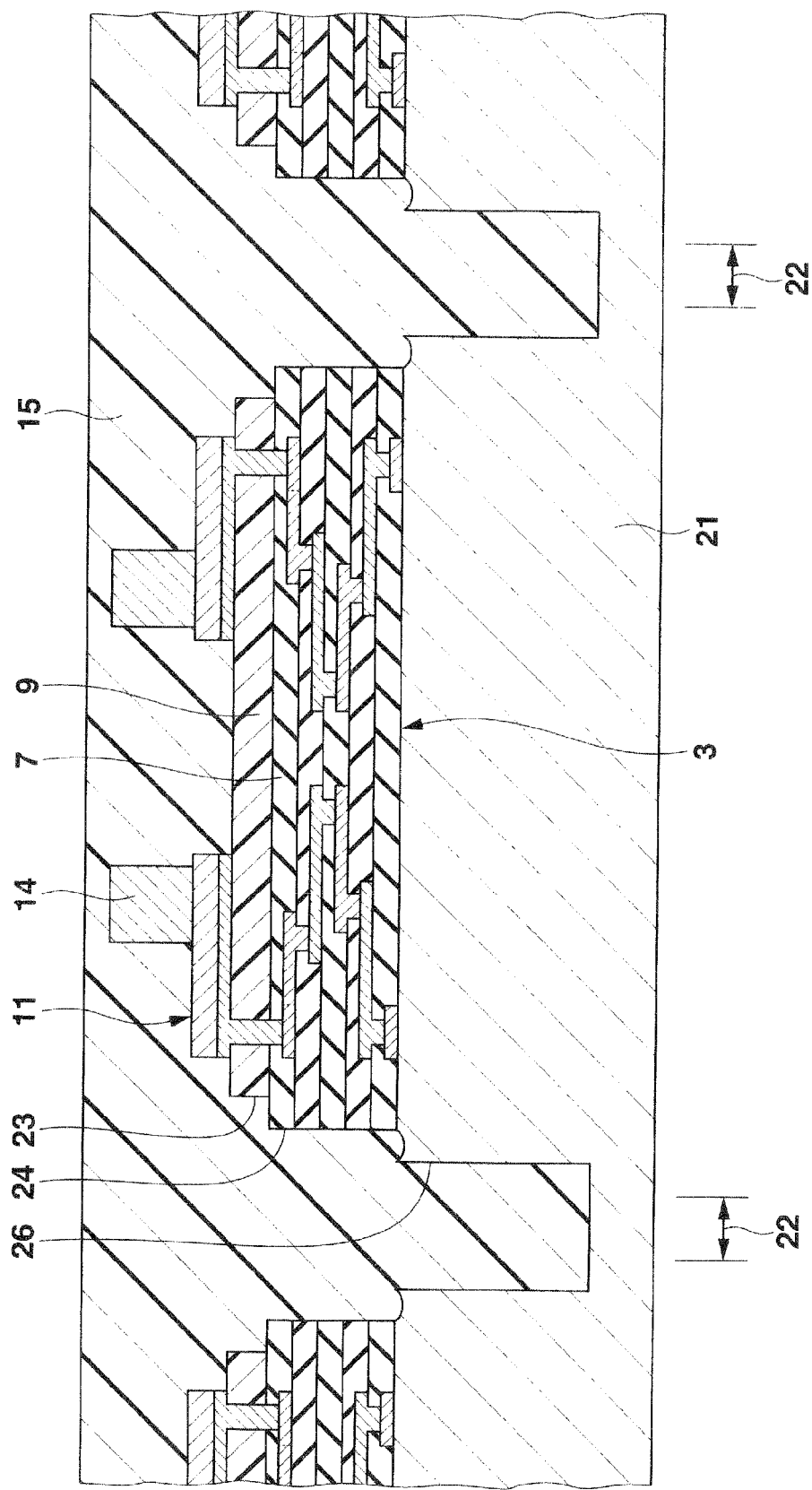
Figure 6:
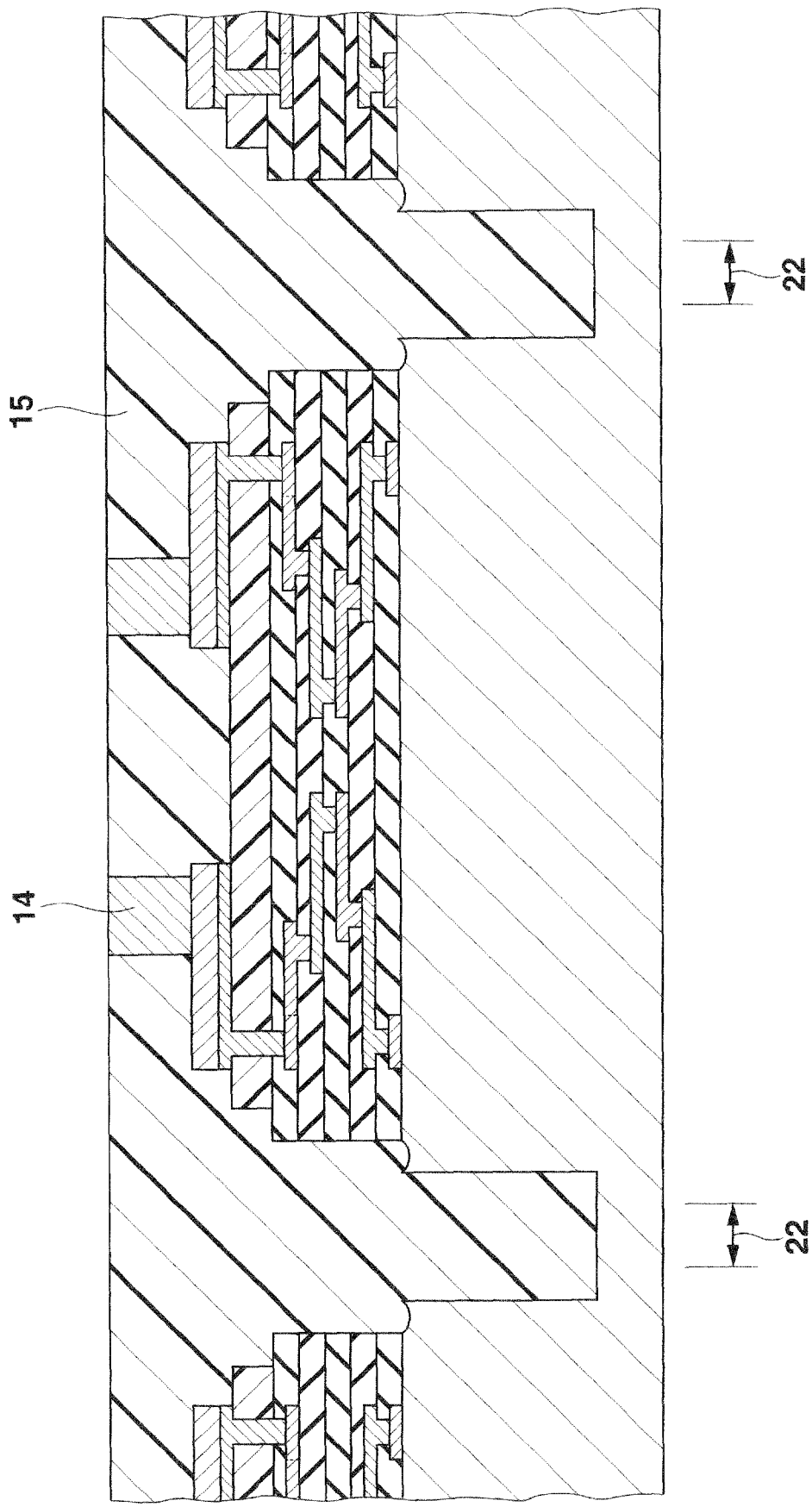
Figure 7:
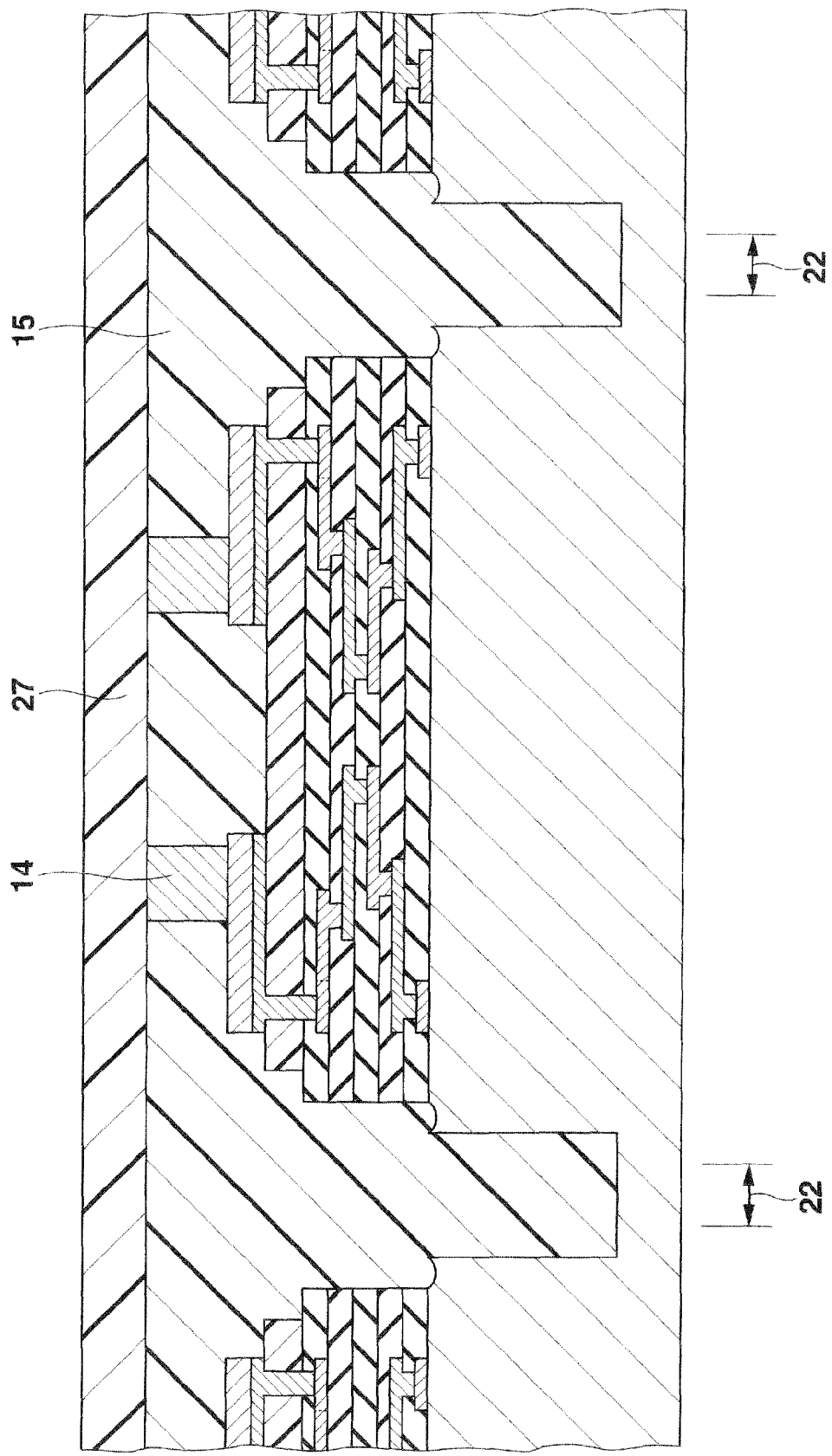
Figure 8:
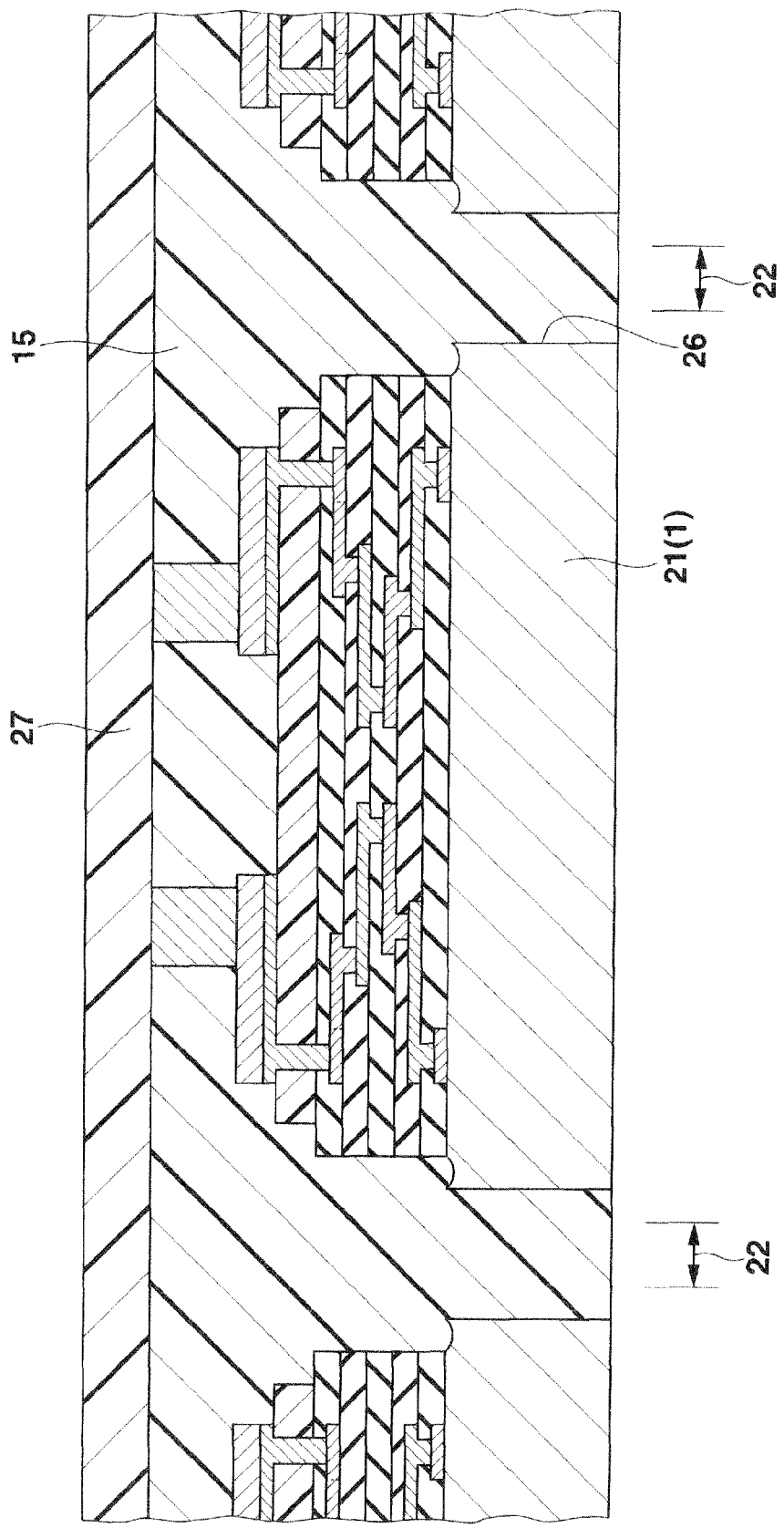
Figure 9:
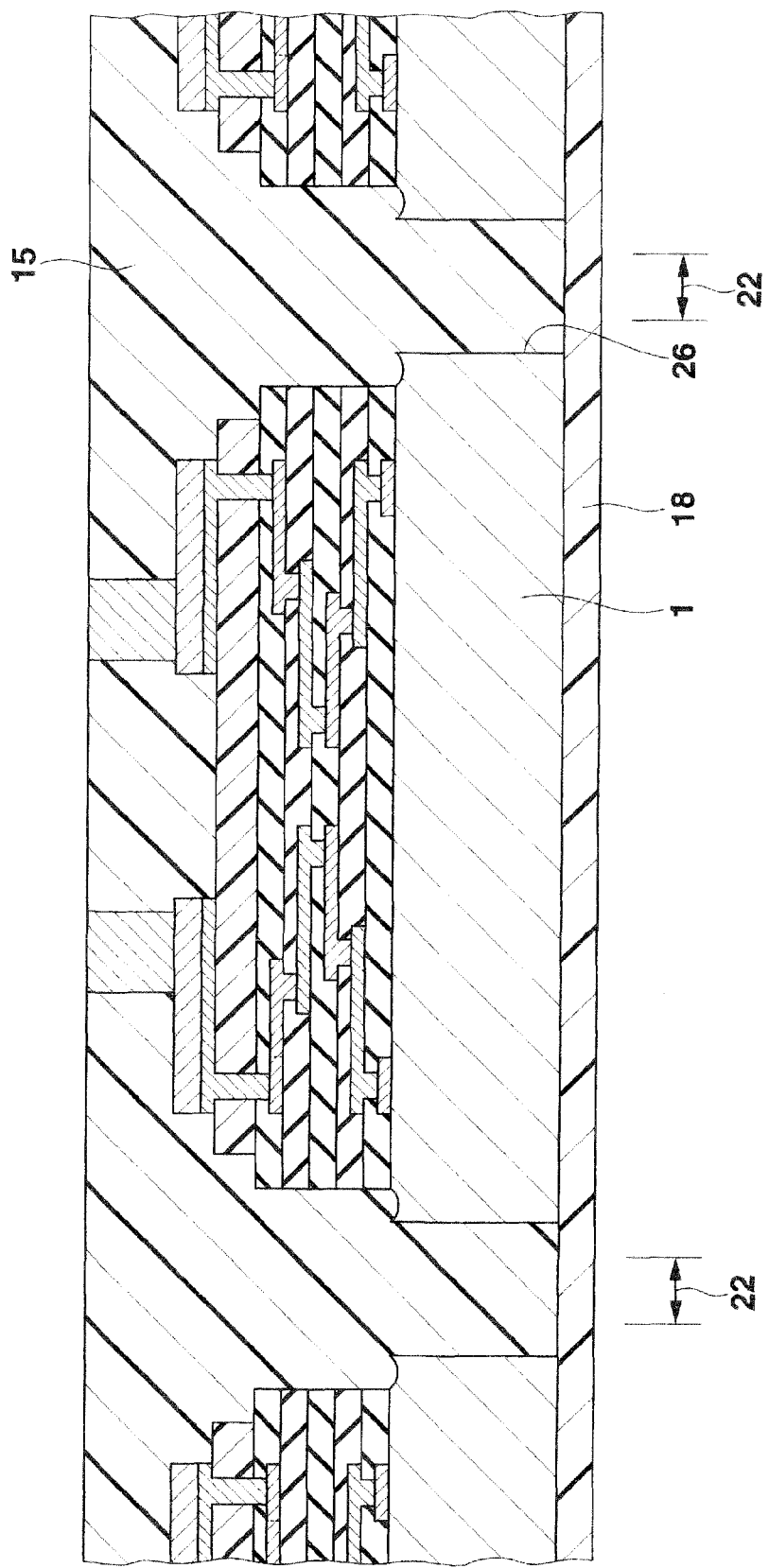
Figure 10:
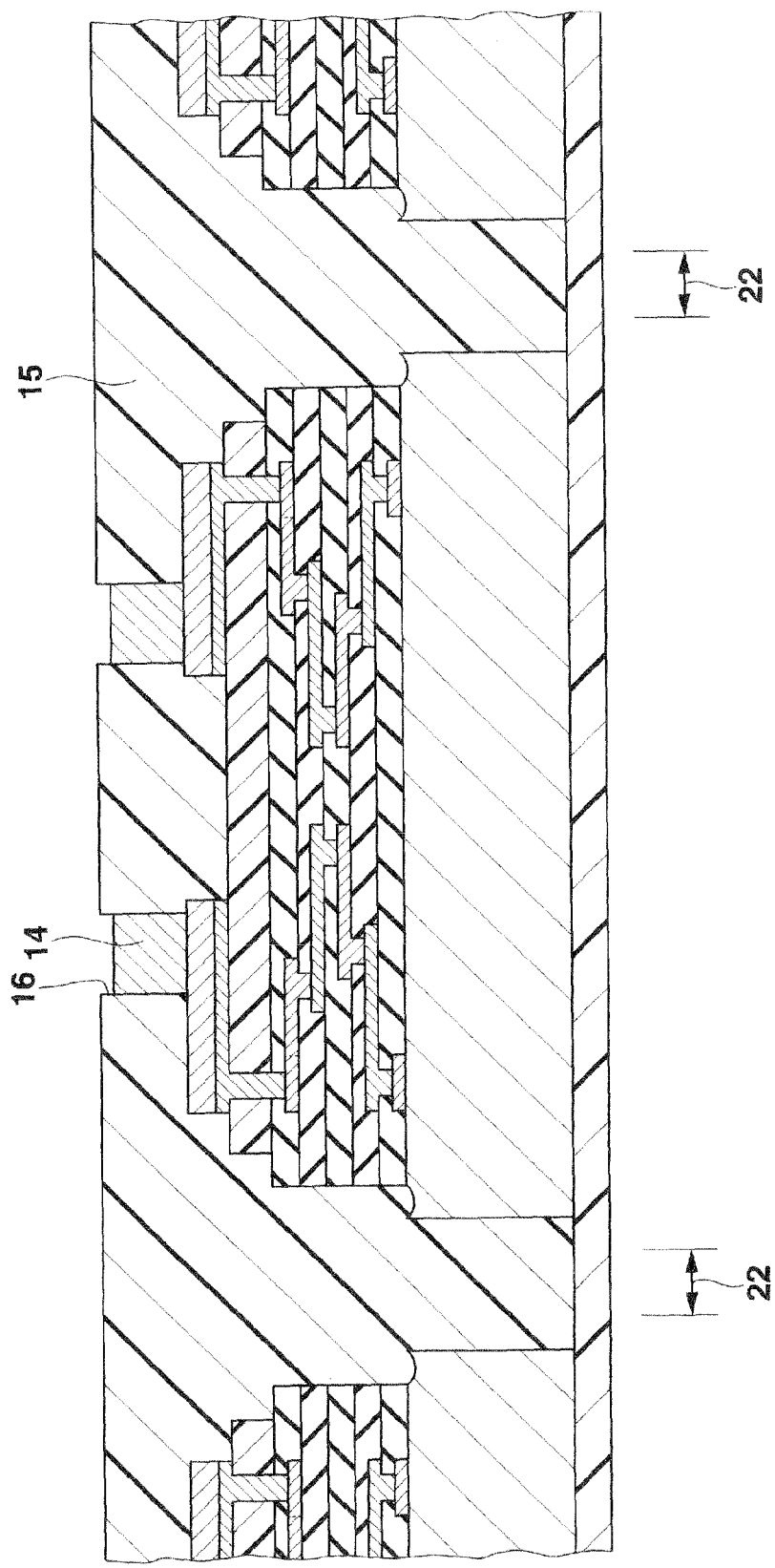
Figure 11:
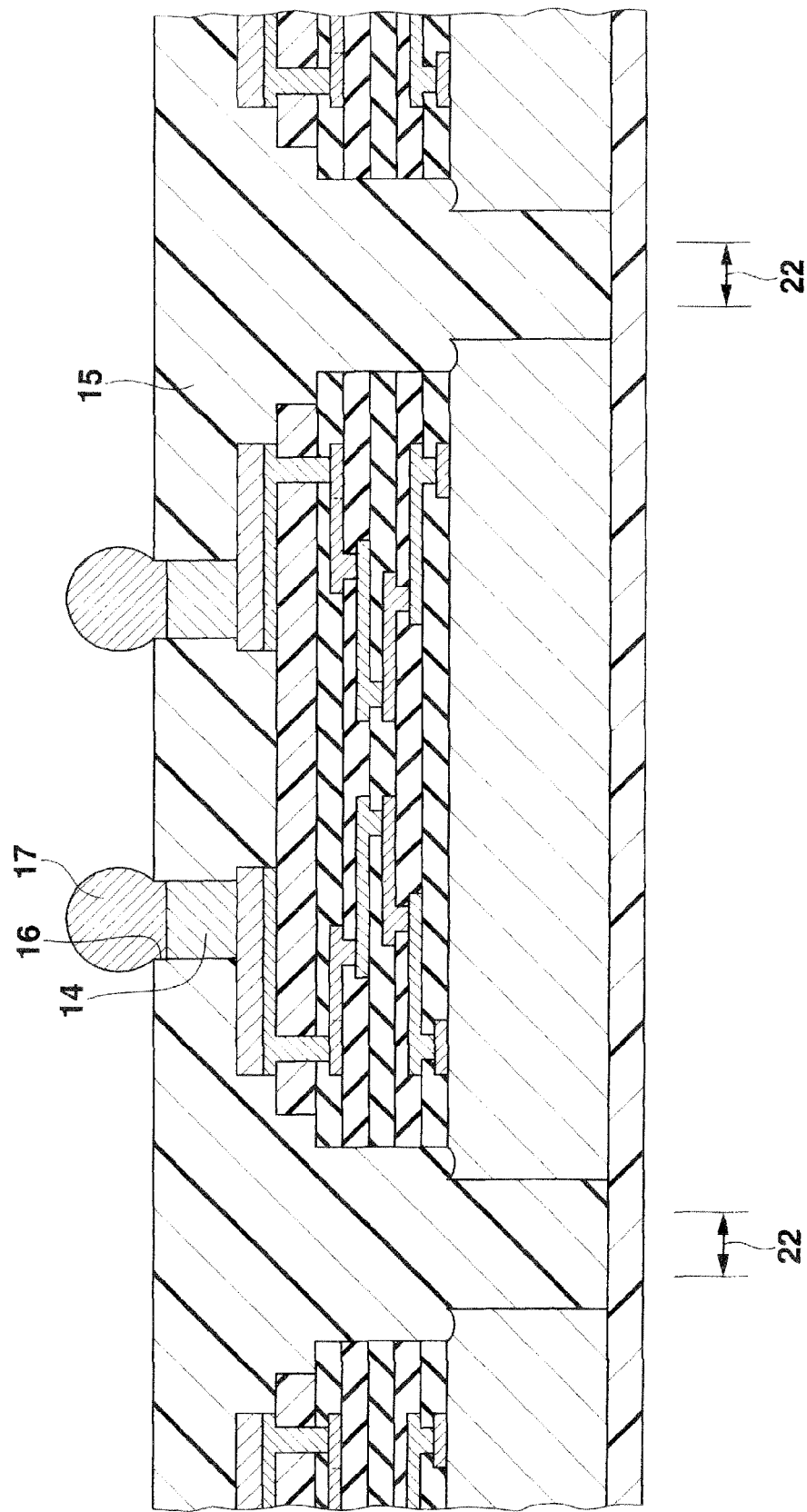
Figure 12:
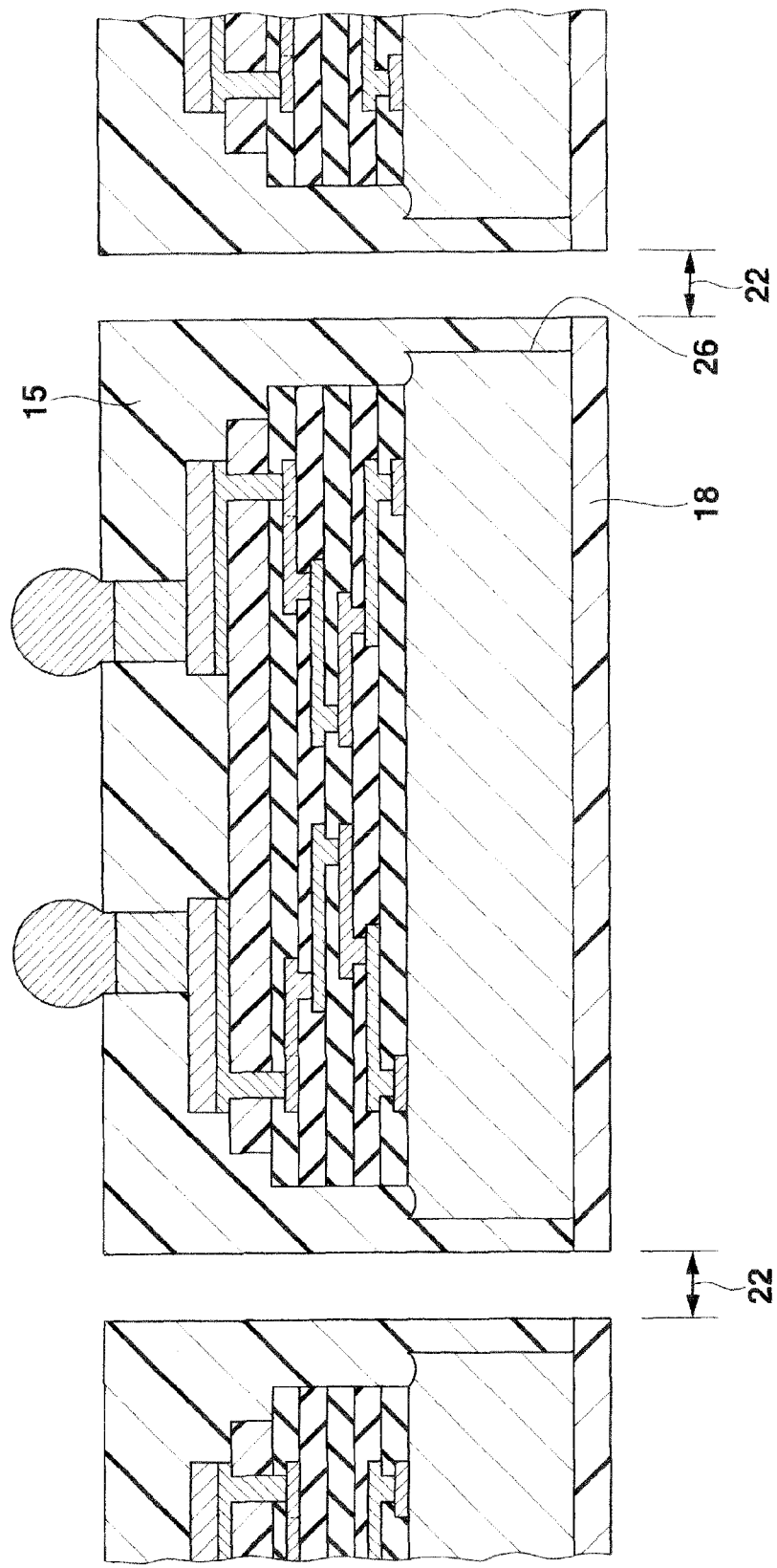
Figure 13:
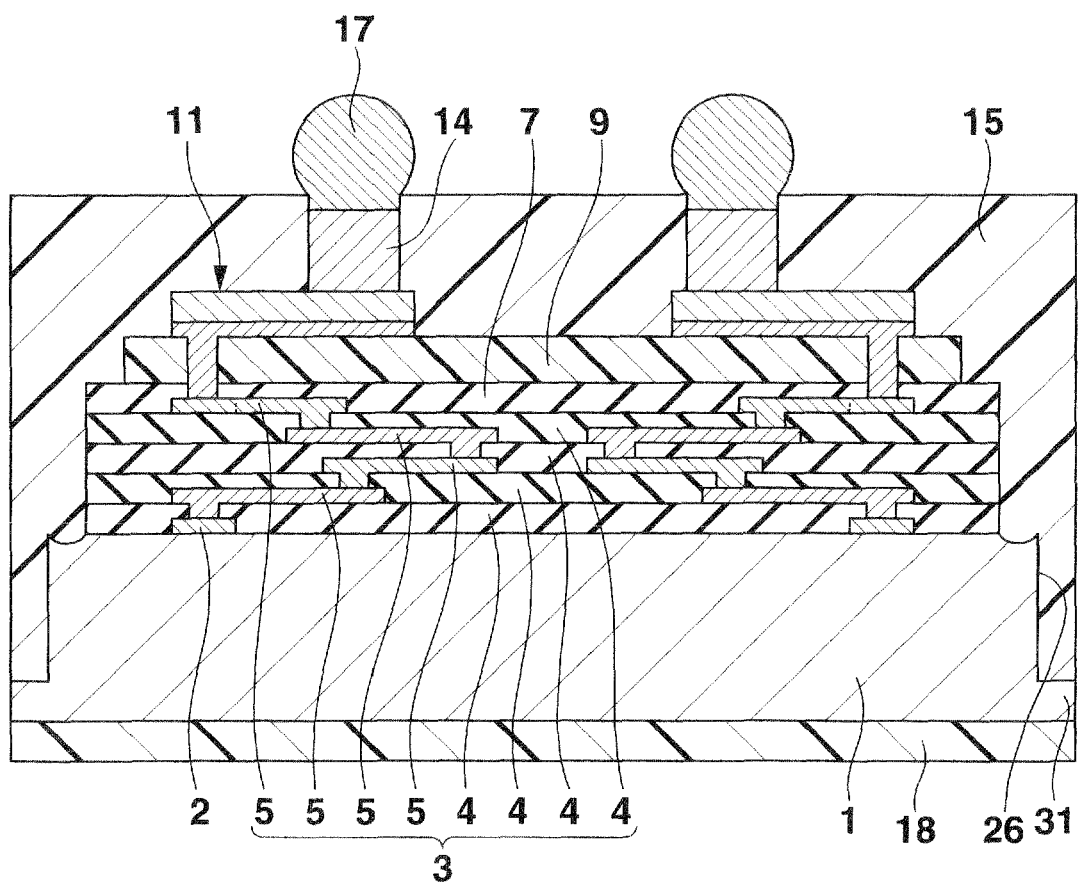
Figure 14:
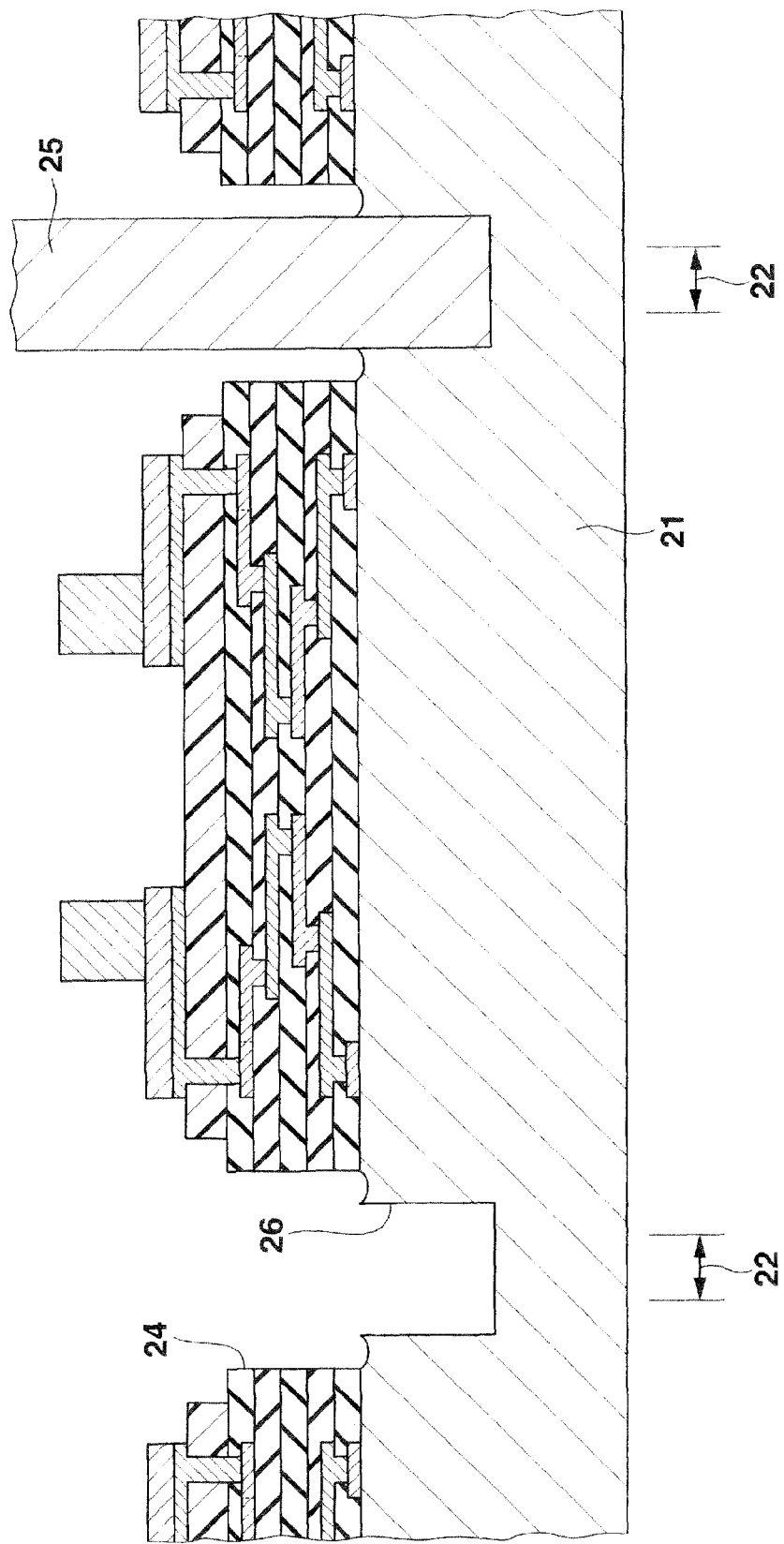
Figure 15:
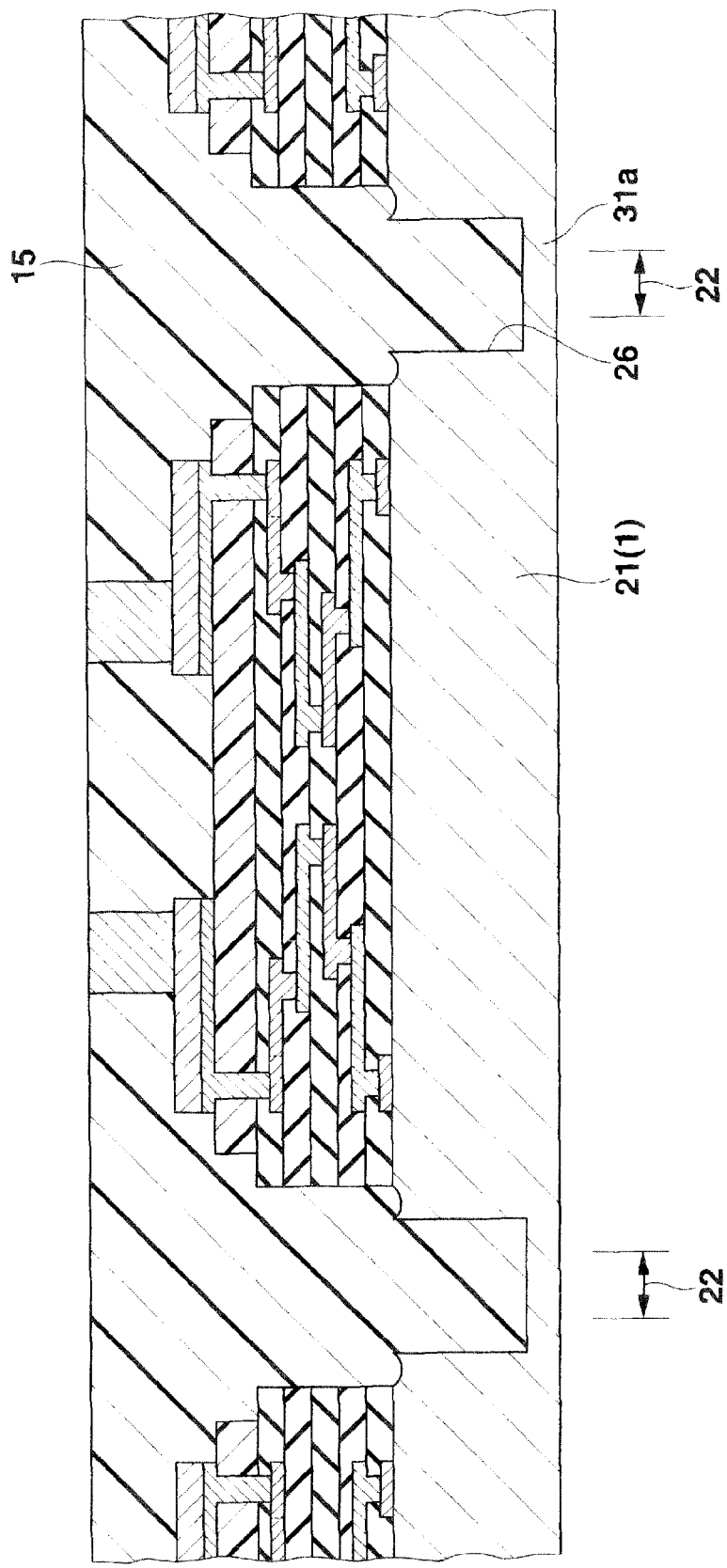
Figure 16:
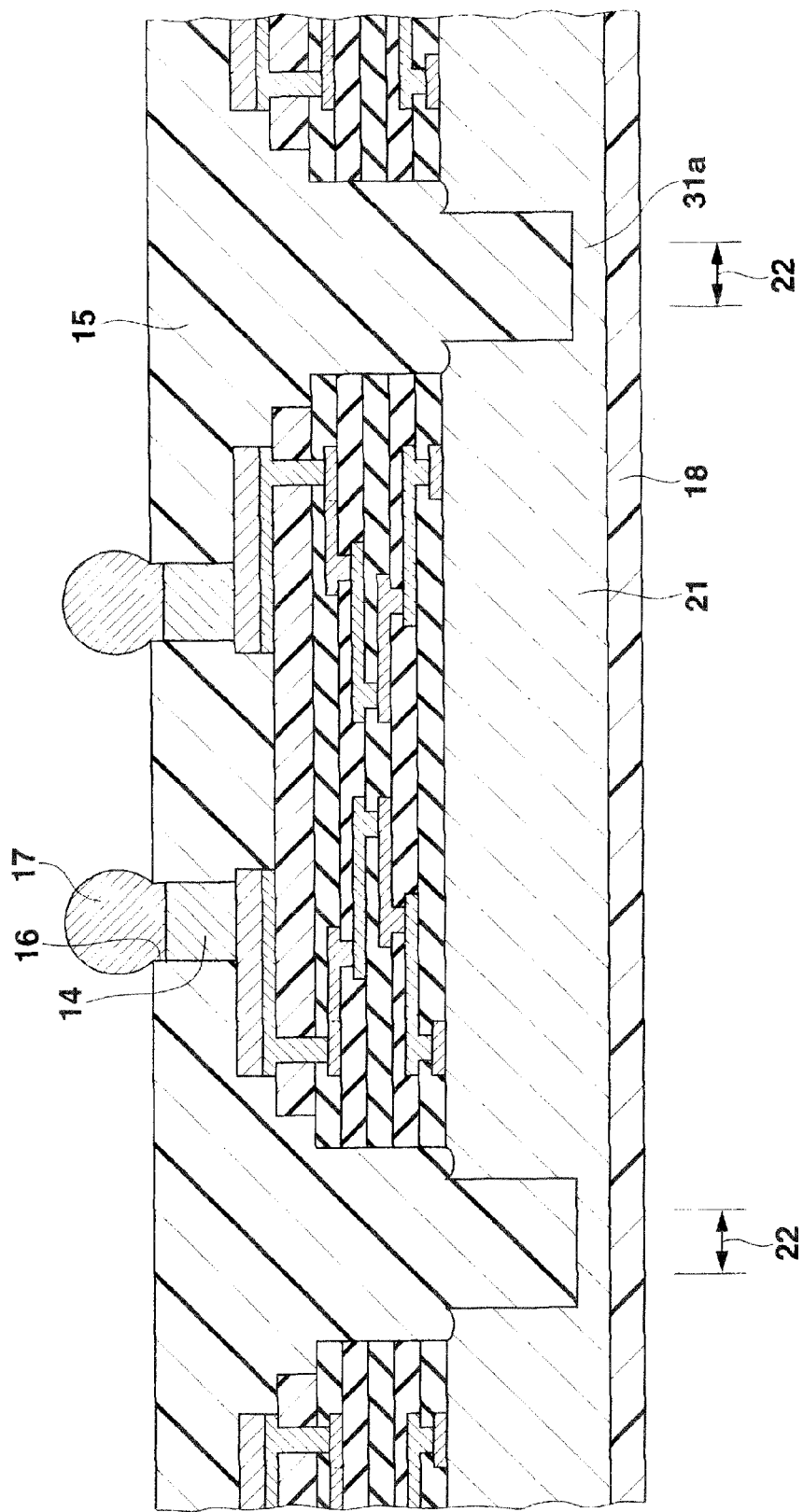
Figure 17:
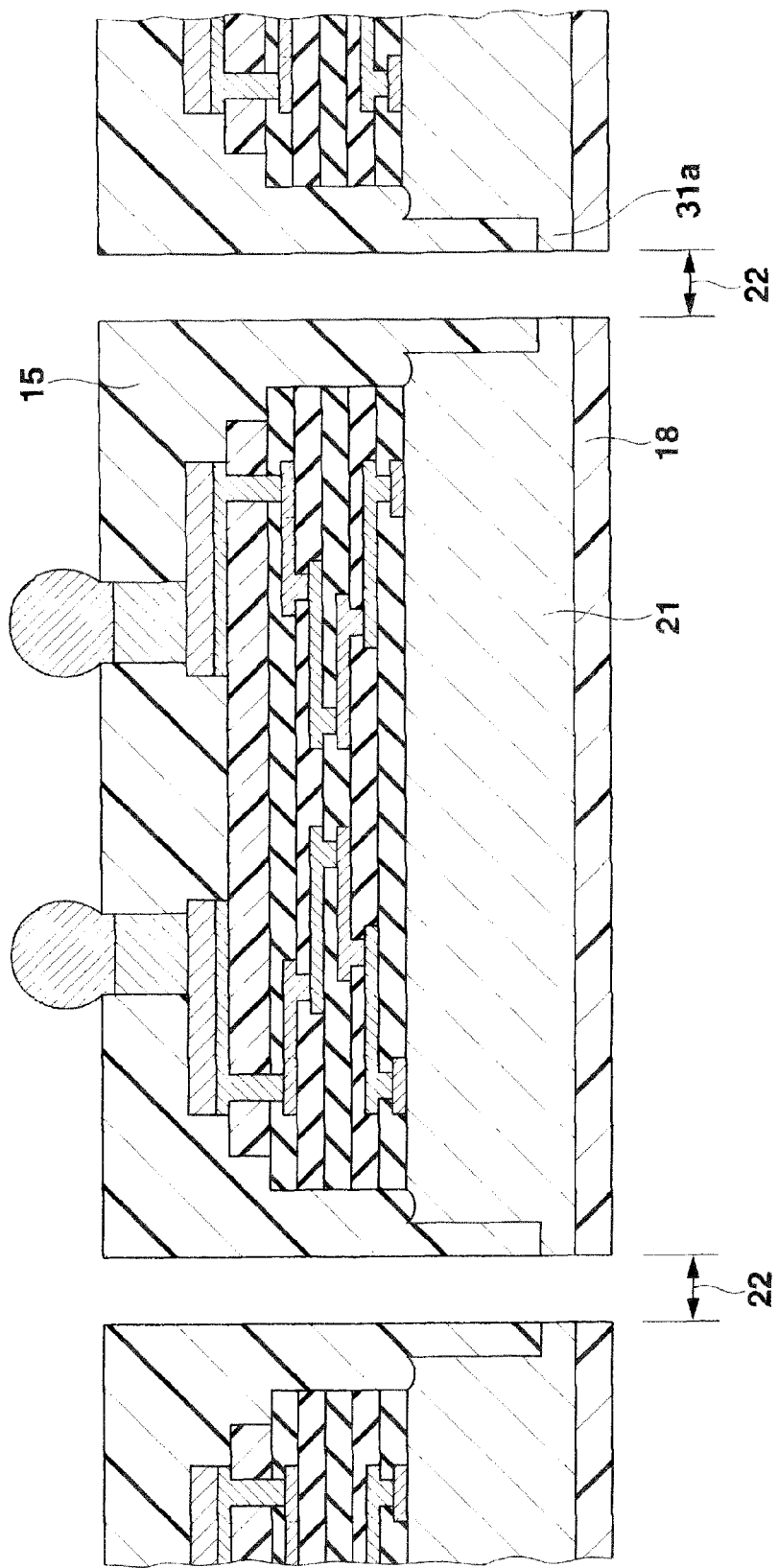
Figure 18:
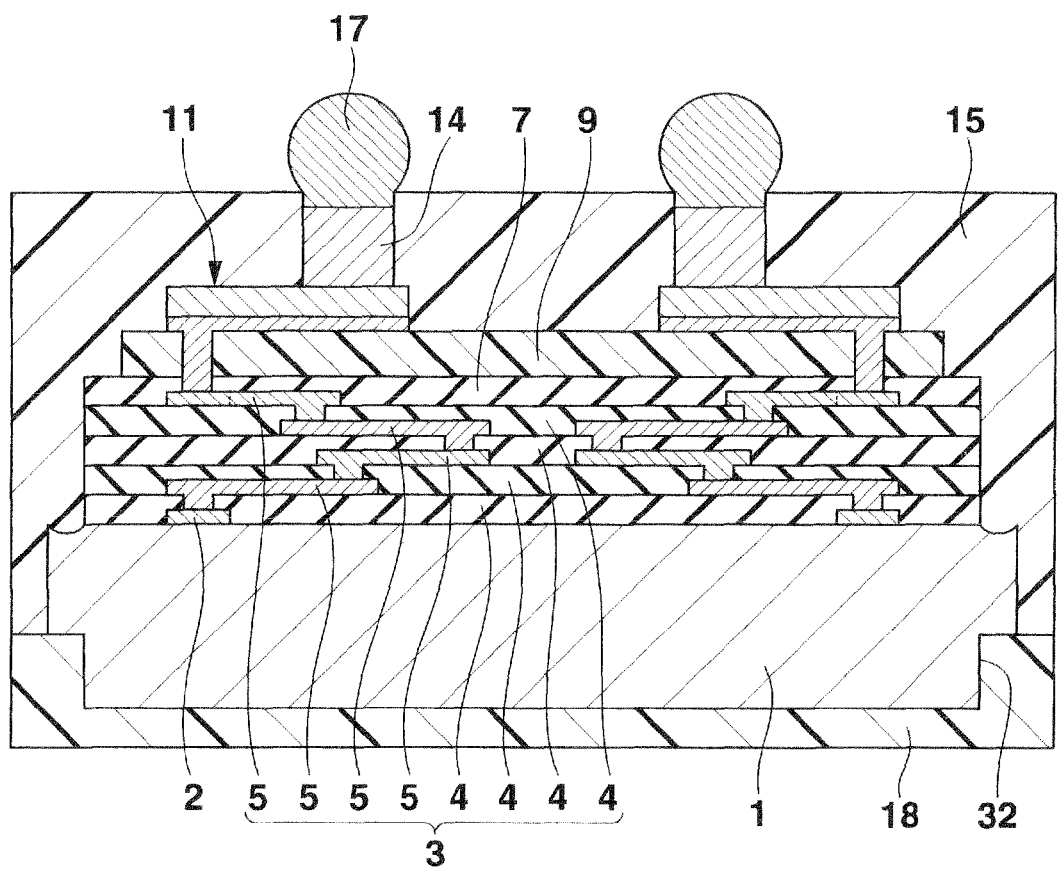
Figure 19:
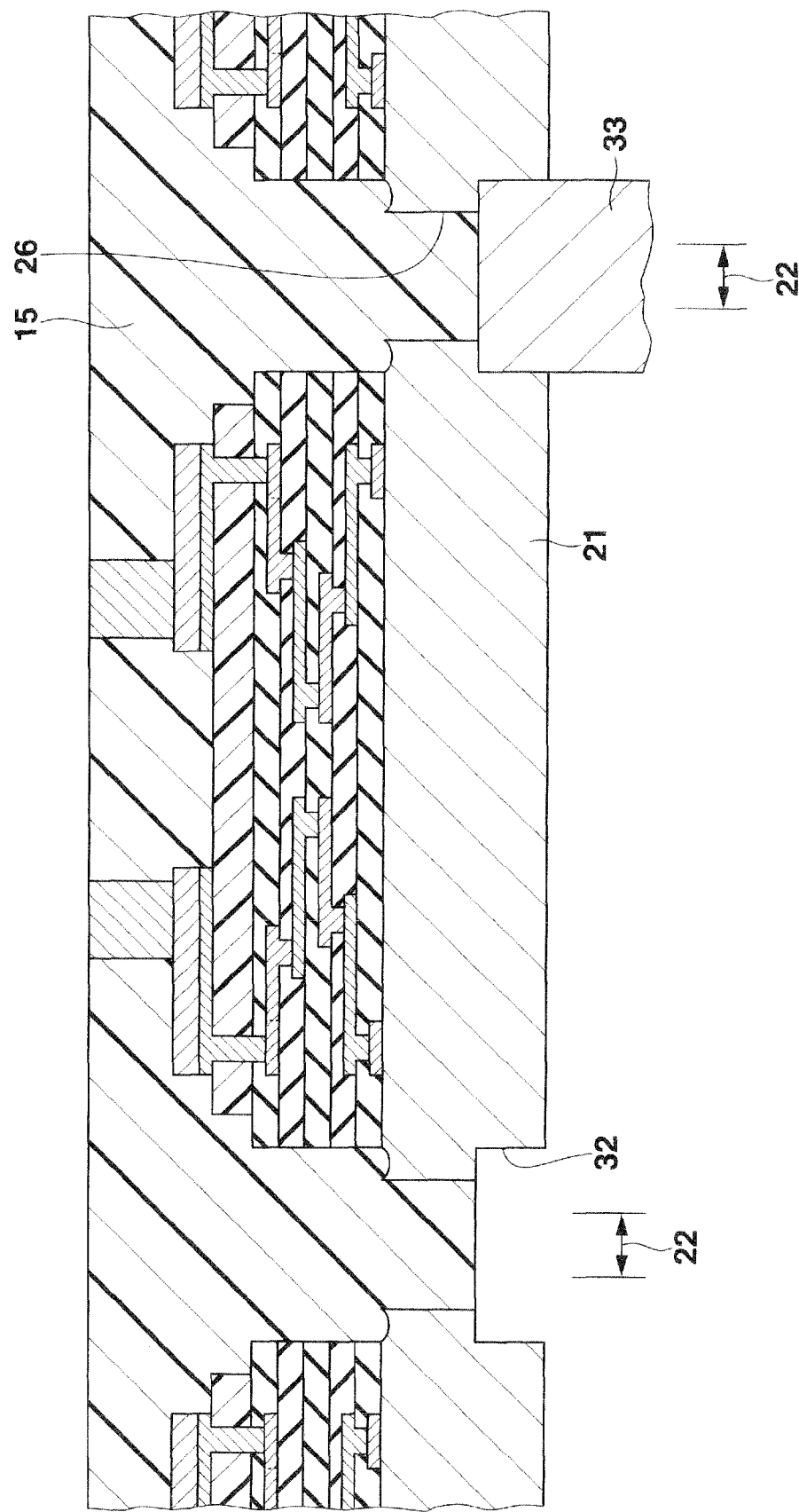
Figure 20:
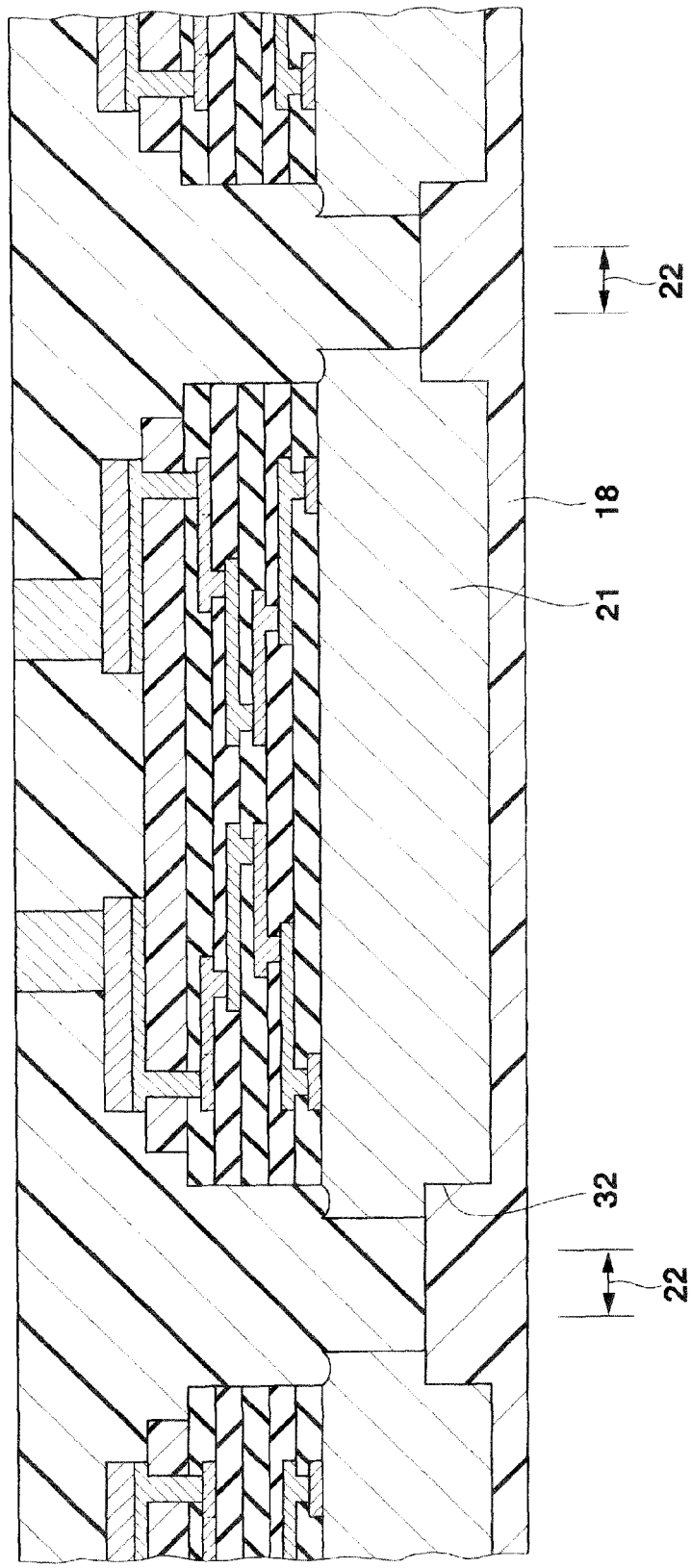
Figure 21:
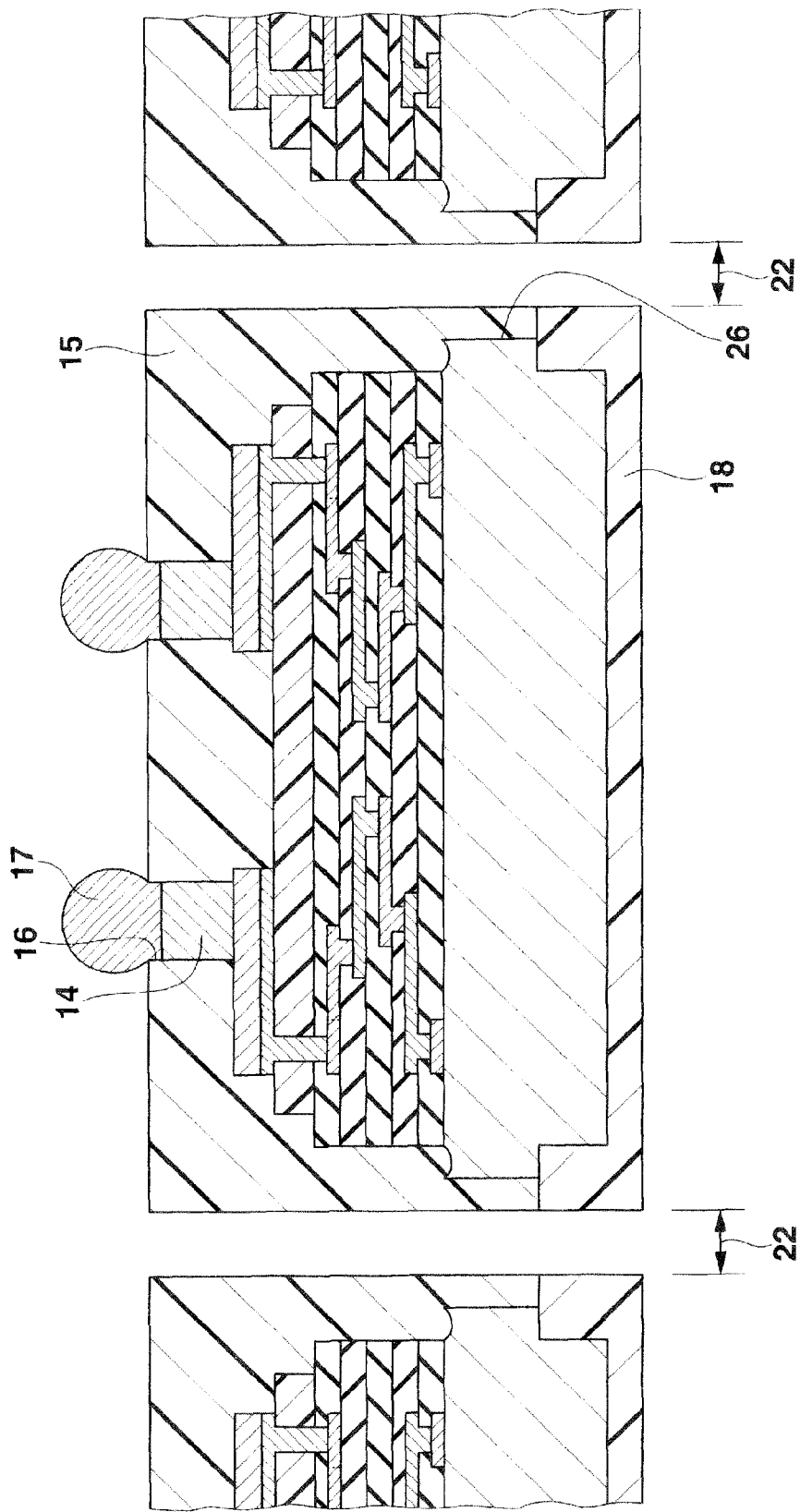
Figure 22:
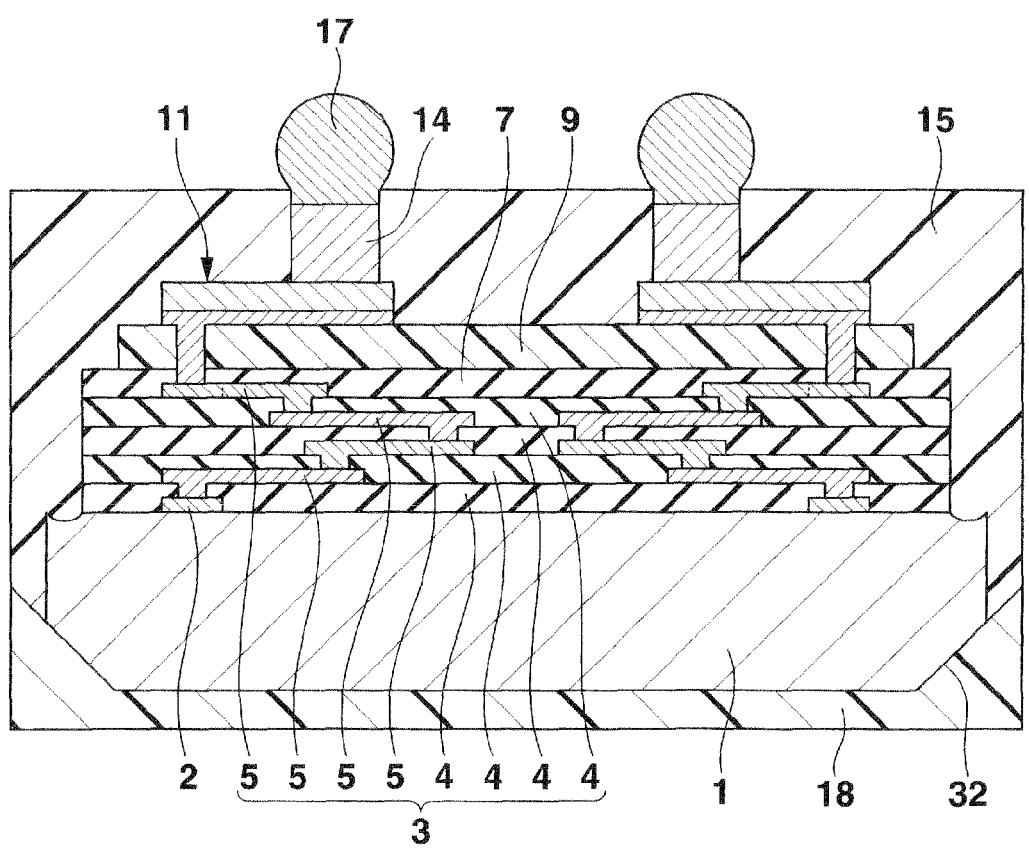
Figure 23:
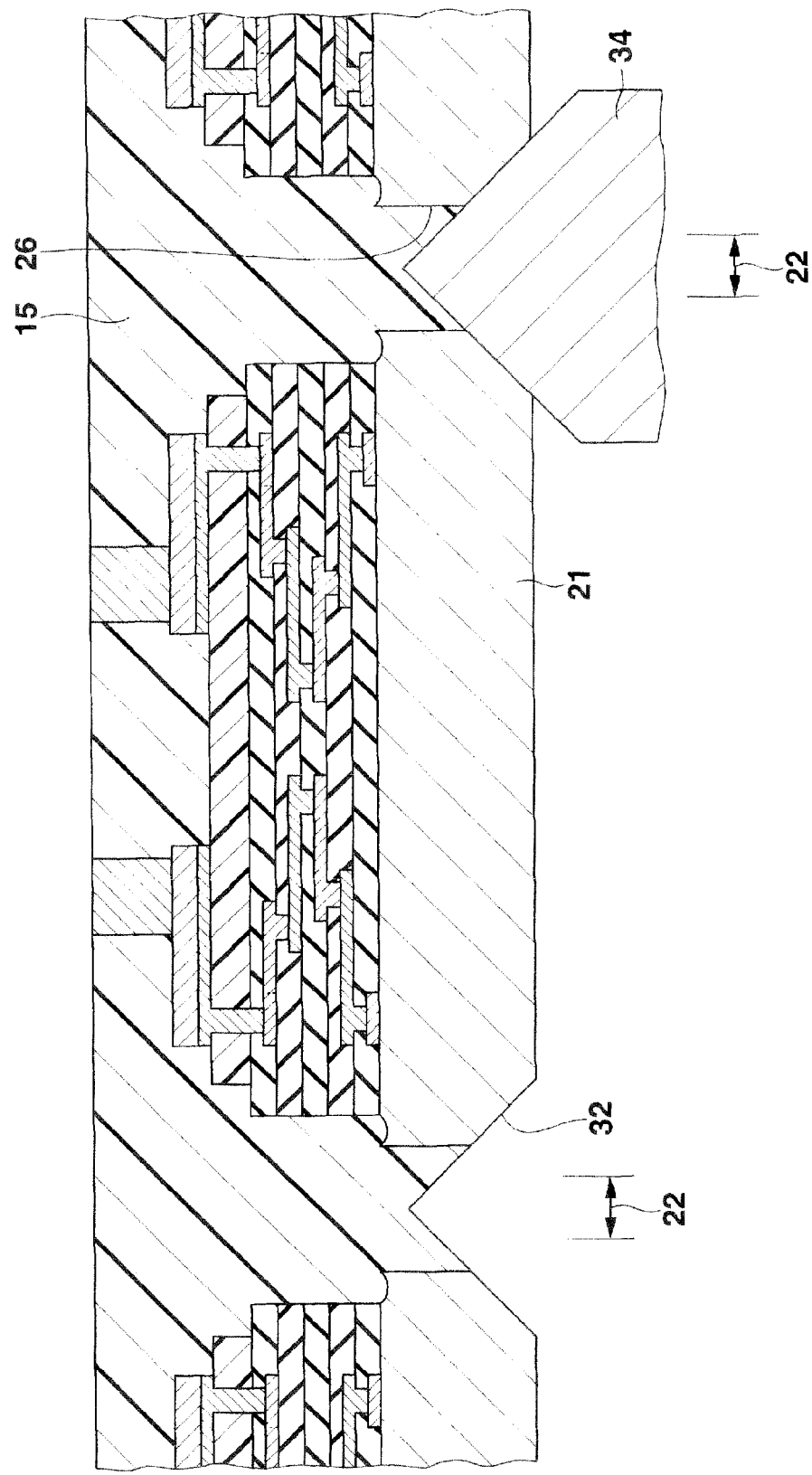
Figure 24:
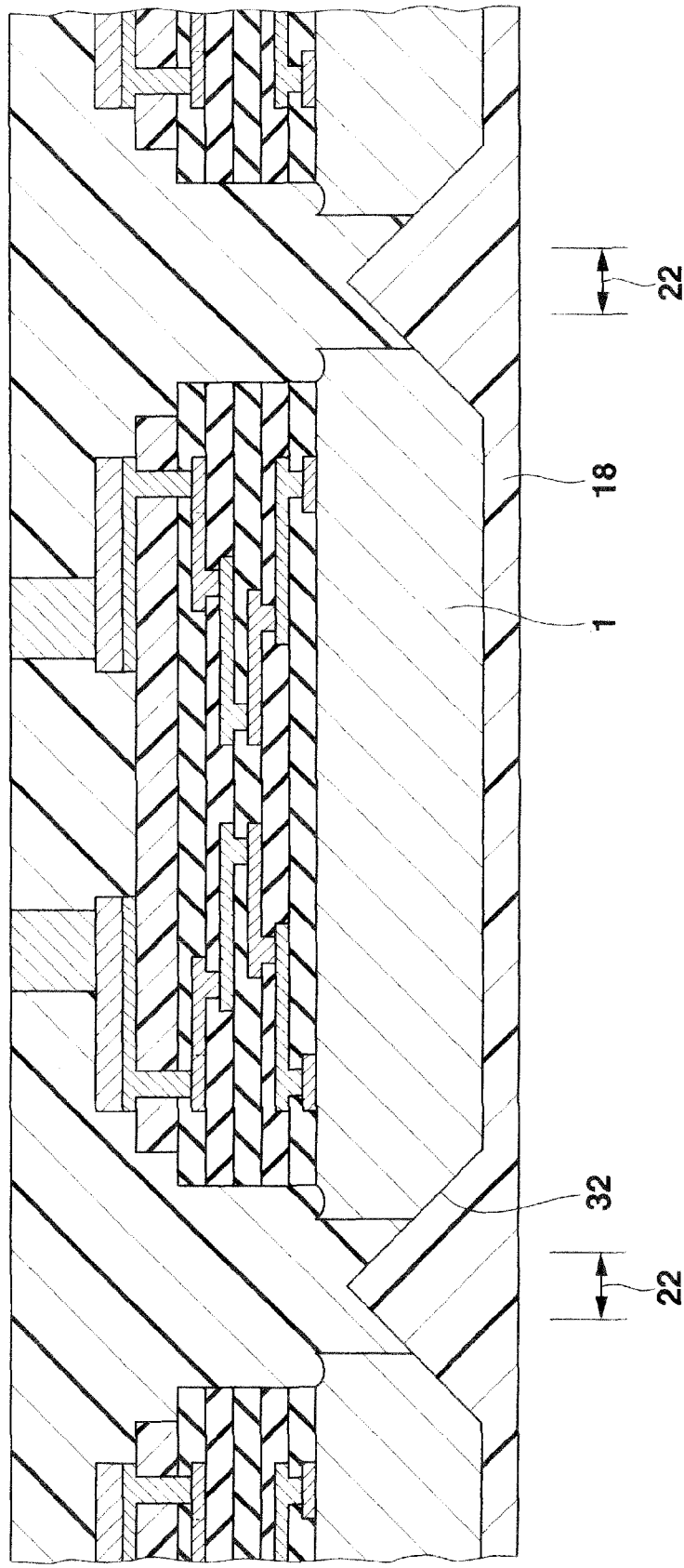
Figure 25:
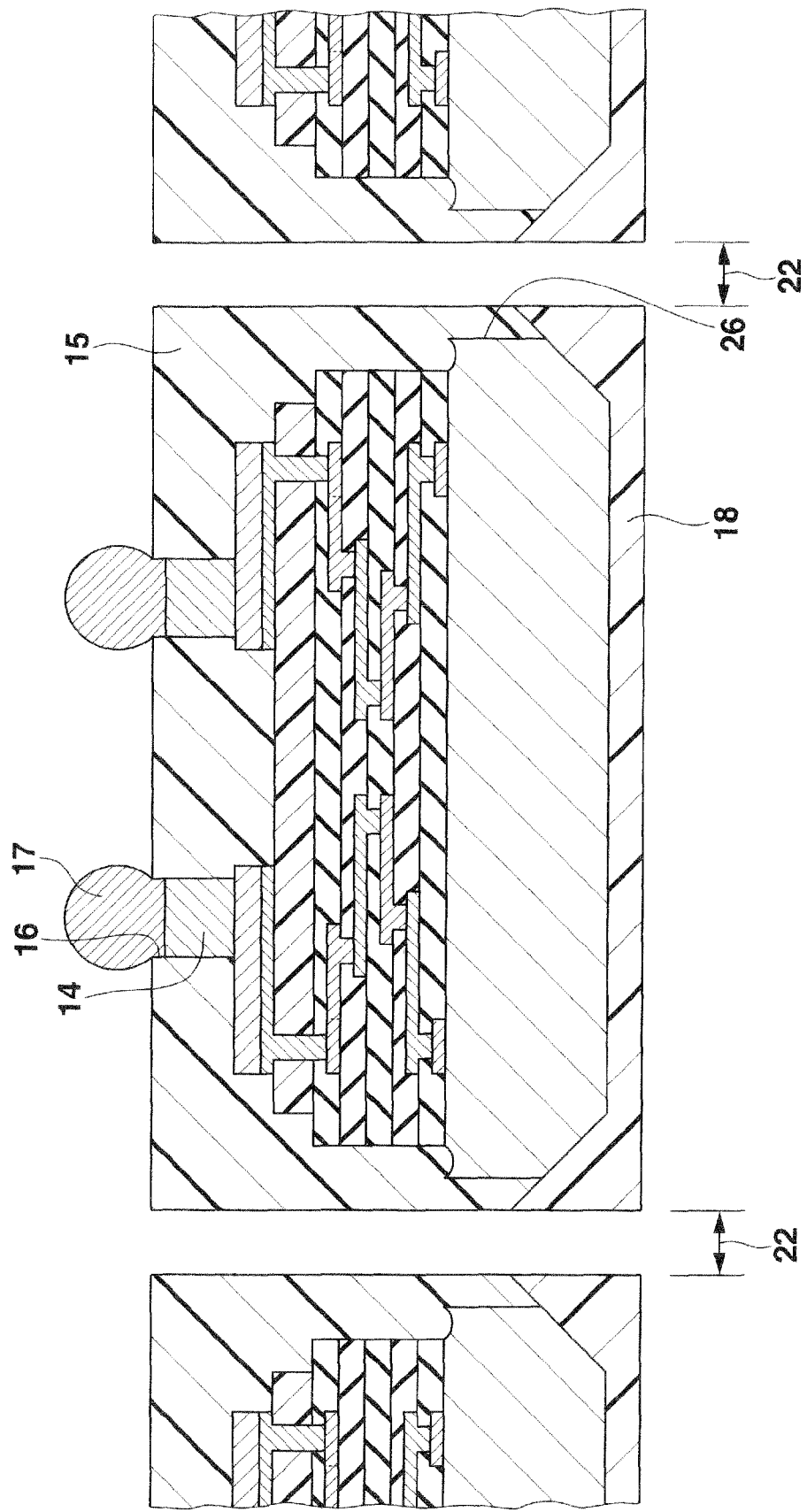
Figure 26:
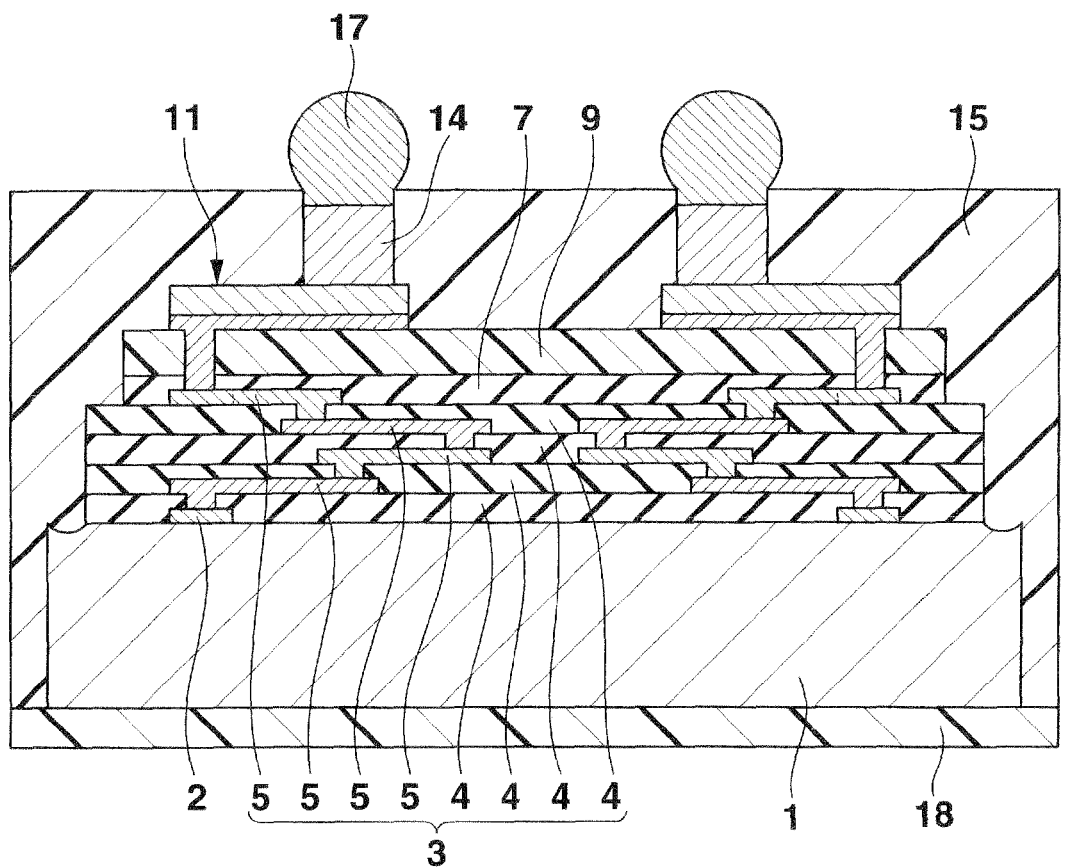
Figure 27:
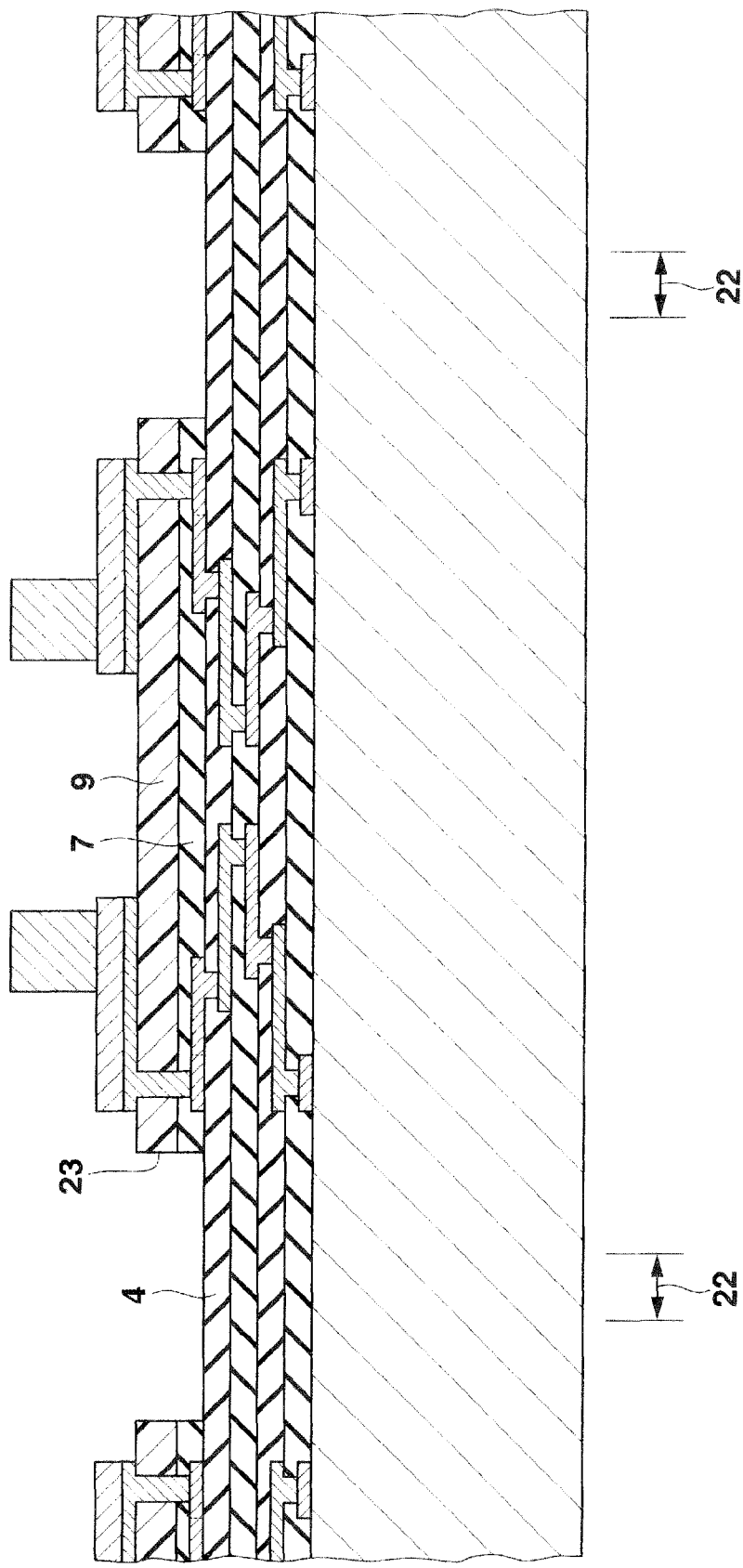
Figure 28:
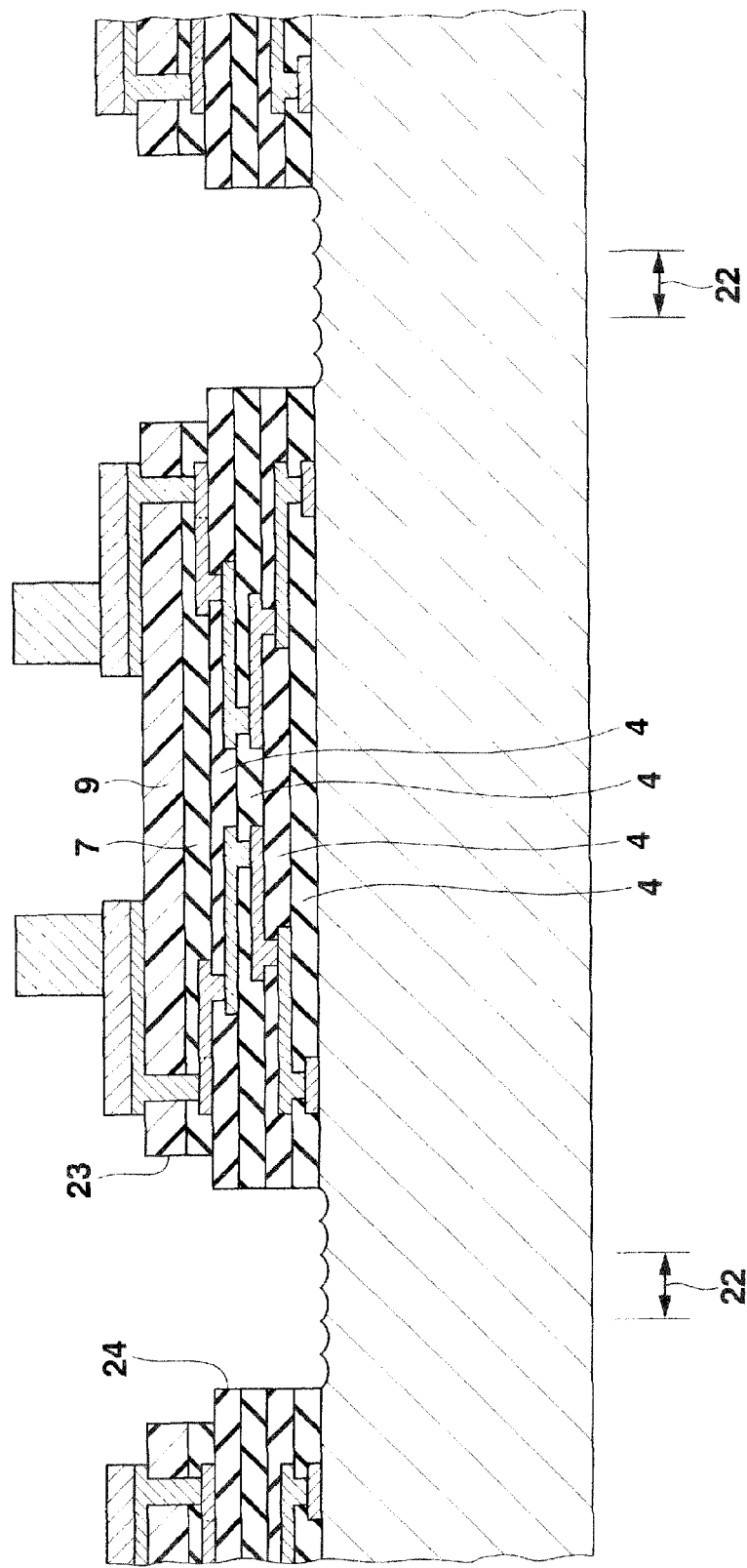
Figure 29:
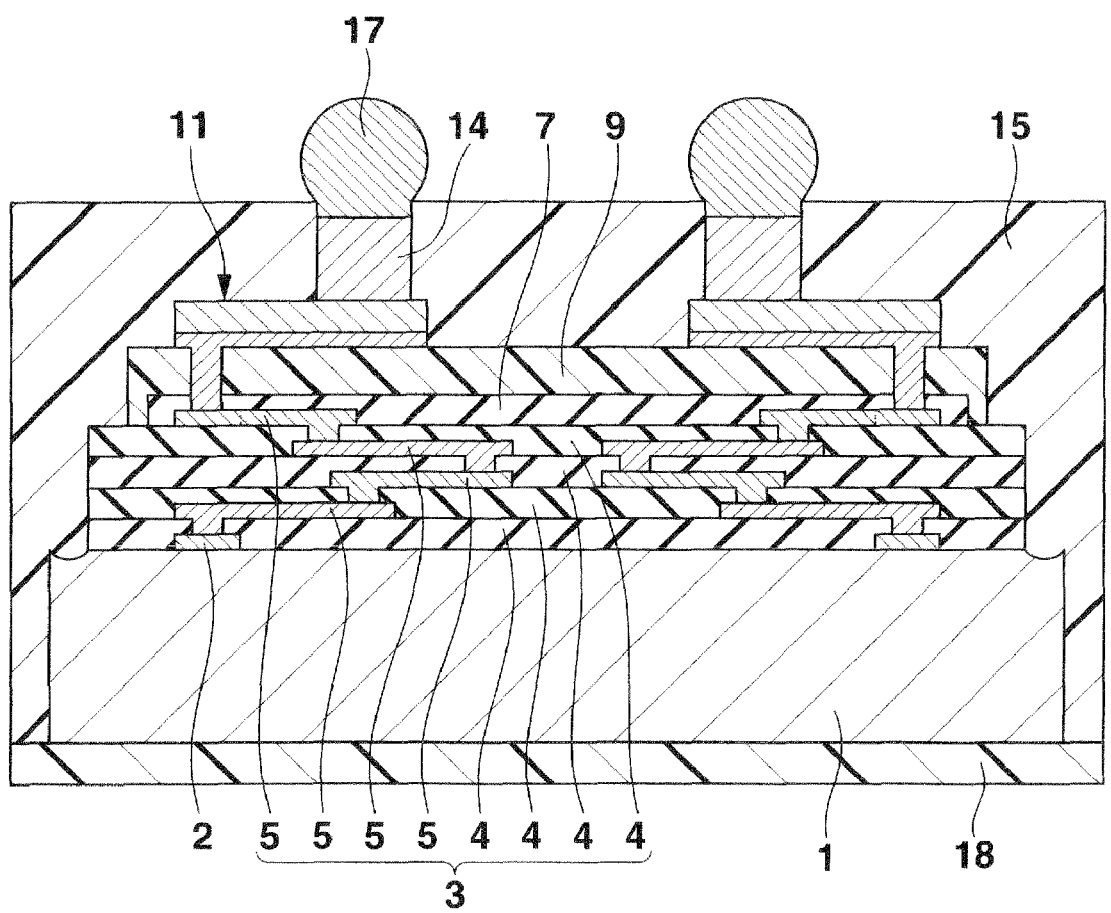

FIG. 3 is a sectional view of a step following FIG. 2;
FIG. 4 is a sectional view of a step following FIG. 3;
FIG. 5 is a sectional view of a step following FIG. 4;
FIG. 6 is a sectional view of a step following FIG. 5;
FIG. 7 is a sectional view of a step following FIG. 6;
FIG. 8 is a sectional view of a step following FIG. 7;
FIG. 9 is a sectional view of a step following FIG. 8;
FIG. 10 is a sectional view of a step following FIG. 9;
FIG. 11 is a sectional view of a step following FIG. 10;
FIG. 12 is a sectional view of a step following FIG. 11;
FIG. 13 is a sectional view of a semiconductor device as a second embodiment of this invention;

FIG. 14 is a sectional view of a predetermined step in one example of a method of manufacturing the semiconductor device shown in FIG. 13;

FIG. 15 is a sectional view of a step following FIG. 14;
FIG. 16 is a sectional view of a step following FIG. 15;
FIG. 17 is a sectional view of a step following FIG. 16;
FIG. 18 is a sectional view of a semiconductor device as a third embodiment of this invention;

FIG. 19 is a sectional view of a predetermined step in one example of a method of manufacturing the semiconductor device shown in FIG. 18;

FIG. 20 is a sectional view of a step following FIG. 19;
FIG. 21 is a sectional view of a step following FIG. 20;
FIG. 22 is a sectional view of a semiconductor device as a fourth embodiment of this invention;

FIG. 23 is a sectional view of a predetermined step in one example of a method of manufacturing the semiconductor device shown in FIG. 22;

FIG. 24 is a sectional view of a step following FIG. 23;
FIG. 25 is a sectional view of a step following FIG. 24;
FIG. 26 is a sectional view of a semiconductor device as a fifth embodiment of this invention;

FIG. 27 is a sectional view of an initially prepared assembly in one example of a method of manufacturing the semiconductor device shown in FIG. 26;

FIG. 28 is a sectional view of a step following FIG. 27; and
FIG. 29 is a sectional view of a semiconductor device as a sixth embodiment of this invention.

DETAILED DESCRIPTION OF THE INVENTION (First Embodiment)

Figure 1:
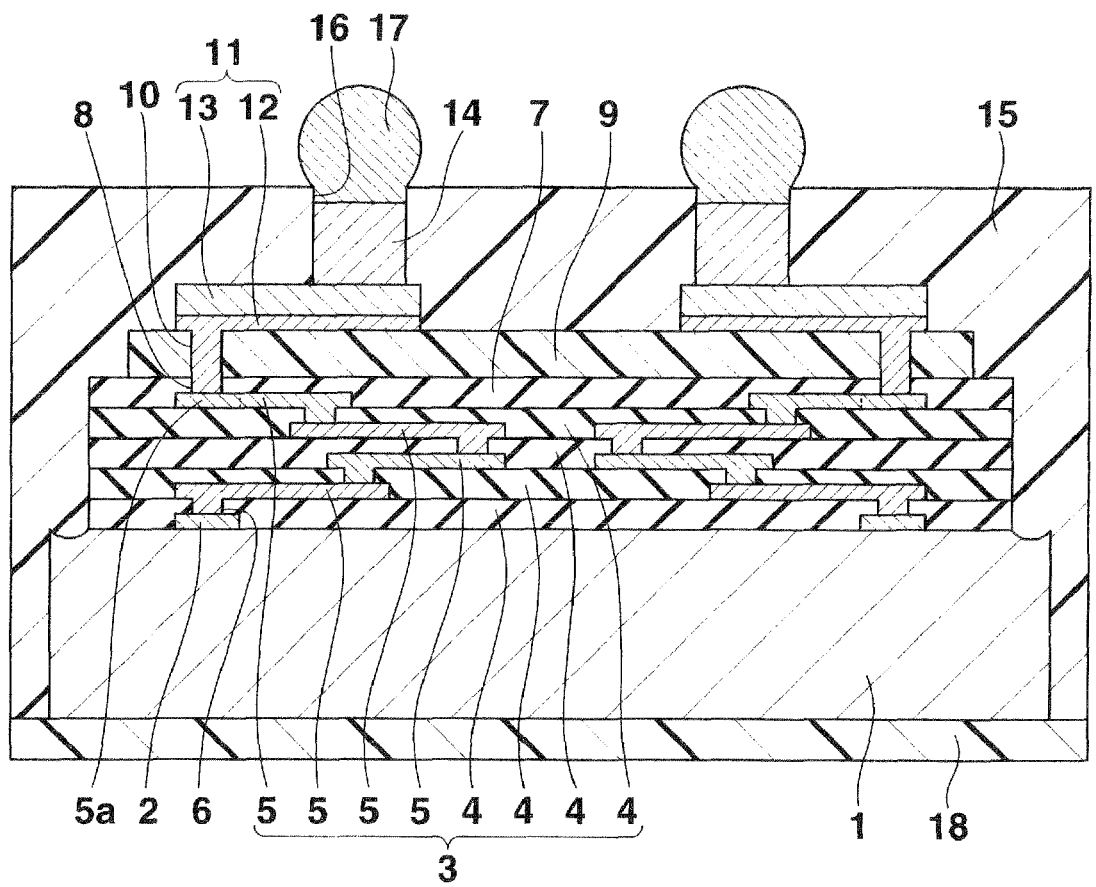
FIG. 1 is a sectional view of a semiconductor device as a first embodiment of this invention.

FIG. 1 shows a sectional view of a semiconductor device as a first embodiment of this invention. This semiconductor device comprises a silicon substrate (semiconductor substrate) 1. An integrated circuit having predetermined functions, in particular, elements (not shown) such as a transistor, a diode, a resistor and a condenser is provided on the upper surface of the silicon substrate 1. Connection pads 2 made of, for example, an aluminum-based metal and connected to the elements of the integrated circuit are provided in the peripheral parts of the upper surface of the silicon substrate 1. Although two connection pads 2 are only shown, a large number of connection pads 2 are actually provided on the upper surface of the semiconductor substrate.

A low dielectric constant film/wiring line stack structure 3 for connecting the elements of the integrated circuit is provided on the upper surface of the silicon substrate 1 except for a peripheral part outside the connection pads 2. The low dielectric constant film/wiring line stack structure 3 is structured so that a plurality of, for example, four low dielectric constant films 4 and the same number of wiring lines 5 made of, for example, copper or an aluminum-based metal are alternately stacked.

The material of the low dielectric constant film 4 includes, for example, a polysiloxane-based material having an Si—O bond and an Si—H bond (hydrogen silsesquioxane [HSQ], relative dielectric constant 3.0), a polysiloxane-based material having an Si—O bond and an Si—$CH_3$ bond (methyl silsesquioxane [MSQ], relative dielectric constant 2.7 to 2.9), carbon-added silicon oxide (carbon-doped silicon oxide [SiOC], relative dielectric constant 2.7 to 2.9), or a low-k material based on an organic polymer. Such a material having a relative dielectric constant of 3.0 or more and a glass transition temperature of 400° C. or more can be used.

The low-k material based on an organic polymer includes, for example, "SiLK" (relative dielectric constant 2.6) manufactured by Dow Chemical Corporation, and "FLARE" (relative dielectric constant 2.8) manufactured by Honeywell Electronic Materials Corporation. Here, having a glass transition temperature of 400° C. or more is intended to be resistant enough to the temperature in a manufacturing process described later. It is to be noted that a porous type of each of the above-mentioned materials can also be used.

Furthermore, in addition to the materials mentioned above, it is also possible to use, as the material of the low dielectric constant film 4, a material which has a relative dielectric constant higher than 3.0 in a normal state but can be made porous so that it may have a relative dielectric constant of 3.0 or less and a glass transition temperature of 400° C. or more. Such a material includes, for example, fluorine-added silicon oxide (fluorinated silicate glass [FSG], relative dielectric constant 3.5 to 3.7), boron-added silicon oxide (boron-doped silicate glass [BSG], relative dielectric constant 3.5), or silicon oxide (relative dielectric constant 4.0 to 4.2).

In the low dielectric constant film/wiring line stack structure 3, the wiring lines 5 of the respective layers are connected to each other between the layers. One end of the lowermost wiring line 5 is connected to the connection pad 2 via an opening 6 provided in the lowermost low dielectric constant film 4. A connection pad portion 5a of the uppermost wiring line 5 is disposed in the peripheral part of the upper surface of the uppermost low dielectric constant film 4.

A passivation film (insulating film) 7 made of an inorganic material such as silicon oxide is provided on the upper surfaces of the uppermost wiring line 5 and the uppermost low dielectric constant film 4. An opening 8 is provided in a part of the passivation film 7 corresponding to the connection pad portion 5a of the uppermost wiring line 5. An upper protective film (insulating film) 9 made of an organic material such as a polyimide-based resin is provided on the upper surface of the passivation film 7. An opening 10 is provided in a part of the protective film 9 corresponding to the opening 8 of the passivation film 7.

An upper wiring line 11 is provided on the upper surface of the upper protective film 9. The upper wiring line 11 has a two-layer structure composed of a foundation metal layer 12 made of, for example, copper and provided on the upper surface of the protective film 9, and an upper metal layer 13 made of copper and provided on the upper surface of the foundation metal layer 12. One end of the upper wiring line 11 is connected to the connection pad portion 5a of the uppermost wiring line 5 via the openings 8, 10 of the passivation film 7 and the upper protective film 9.

A columnar electrode (external connection bump electrode) 14 made of copper is provided on the upper surface of a connection pad portion (electrode connection pad portion) of the upper wiring line 11. A sealing film 15 made of an organic resin such as epoxy-based resin is provided on the peripheral side surfaces of the silicon substrate 1, the low dielectric constant film/wiring line stack structure 3, the passivation film 7 and the upper protective film 9 and on the upper surface of the upper protective film 9 including the upper wiring line 11 so that the upper surface of this sealing film 15 is higher than the upper surface of the columnar electrode 14. Thus, a step 16 is provided in the sealing film 15 on the columnar electrode 14. A solder ball 17 is provided on and above the step 16 of the sealing film 15 so that this solder ball is connected to the upper surface of the columnar electrode 14.

Here, the side surface of the low dielectric constant film/wiring line stack structure 3 is substantially flush with the side surface of the passivation film 7, and the side surfaces of these films are covered with the sealing film 15. The side surface of the upper protective film 9 is located inside the side surface of the passivation film 7. The lower surface of the sealing film 15 provided on the peripheral side surface of the silicon substrate 1 is flush with the lower surface of the silicon substrate 1. A lower protective film 18 made of an organic resin such as epoxy-based resin is provided on the lower surface of the silicon substrate 1 and on the lower surface of the sealing film 15 provided on the peripheral side surface of the silicon substrate 1.

As described above, in this semiconductor device, the low dielectric constant film/wiring line stack structure 3 made up of the stack of the low dielectric constant films 4 and the wiring lines 5 is provided on the silicon substrate 1 except for the peripheral part of this substrate. Moreover, the side surfaces of the low dielectric constant film/wiring line stack structure 3 and the passivation film 7 are covered with the sealing film 15. Thus, the low dielectric constant film/wiring line stack structure 3 does not easily come off the silicon substrate 1. Further, the lower surface of the silicon substrate 1 and the lower surface of the sealing film 15 provided on the peripheral side surface of the silicon substrate 1 are covered with the lower protective film 18, so that the lower surface of the silicon substrate 1 can be protected against cracks.

Next, one example of a method of manufacturing this semiconductor device is described. First, as shown in FIG. 2, an assembly is prepared in which there are provided, on a silicon substrate in a wafer state (hereinafter referred to as a semiconductor wafer 21), a connection pad 2, four low dielectric constant films 4, four wiring lines 5, a passivation film 7, an upper protective film 9, an upper wiring line 11 having a two-layer structure composed of a foundation metal layer 12 and an upper metal layer 13, and a columnar electrode 14.

In this case, the thickness of the semiconductor wafer 21 is greater to some degree than the thickness of the silicon substrate 1 shown in FIG. 1. As the material of the low dielectric constant film 4, the materials mentioned above can be taken as examples, and a material having a relative dielectric constant of 3.0 or less and a glass transition temperature of 400° C. or more can be used including the porous type of such material. The height of the columnar electrode 14 is greater to some degree than the height of the columnar electrode 14 shown in FIG. 1. In FIG. 2, a zone indicated by the sign 22 is a zone corresponding to the dicing street. An opening 23 is formed in the upper protective film 9 in the region of the dicing street 22 and both neighboring sides.

The opening 23 of the upper protective film 9 is formed by a photolithographic method in an organic resin such as polyimide-based or epoxy-based resin formed into a film over the entire passivation film 7 by, for example, a spin coating method or screen printing method. In a planar view, the opening 23 is in the shape of a frame enclosing each device region (each region inside the dicing street 22).

Then, as shown in FIG. 3, a first trench 24 is formed in the passivation film 7 and the four low dielectric constant films 4 in the region of the dicing street 22 and both neighboring sides within the opening 23 of the upper protective film 9, by laser processing in which a laser beam is applied. The first trench 24 is formed with a width smaller than that of the opening 23 of the upper protective film 9. Similarly to the opening 23 of the upper protective film 9, the first trench 24 is provided in the shape of a frame outside the side surface of the passivation film 7 around each device region in a planar view.

Furthermore, in this state, the four low dielectric constant films 4 and the passivation film 7 stacked on the semiconductor wafer 21 are separated by the first trenches 24, such that the low dielectric constant film/wiring line stack structure 3 is formed. Moreover, the side surface of the passivation film 7 is substantially flush with the side surface of the low dielectric constant film/wiring line stack structure 3.

Here, since the low dielectric constant film 4 is fragile, a large number of cuts and damages are caused to the low dielectric constant film 4 in section when the first trench 24 is formed by cutting with a blade. Thus, a recommended way of forming the first trench 24 is to cut the low dielectric constant film 4 by laser beam application. When the first trench 24 is formed by laser beam application, the upper surface of the silicon substrate 1 melts when a laser beam is applied onto the upper surface of the silicon substrate 1, and the melted parts splash from the silicon substrate 1 and then drop onto the silicon substrate 1, so that the bottom surface of the first trench 24 become an uneven surface 24a. That is, the upper surface of the semiconductor wafer 21 around the low dielectric constant film/wiring line stack structure 3 is exposed via the first trench 24 and becomes the uneven surface 24a.

In the method described in the embodiment, a laser beam is applied to the low dielectric constant film/wiring line stack structure 3 to form the first trench 24 in the state shown in FIG. 2 after the upper protective film 9 is formed all over the passivation film 7 and this upper protective film 9 is patterned to form the opening 23. Otherwise, the upper protective film 9 may be formed all over the passivation film 7, and with the upper protective film 9 unpatterned, a laser beam may be applied to simultaneously form the first trench 24 in the upper protective film 9, the passivation film 7 and the low dielectric constant film/wiring line stack structure 3.

However, the disadvantage when the material of the upper protective film 9 is an organic resin such as a polyimide-based resin and is thick is that the organic resin film is difficult to cut because the capacity of the organic resin film to absorb laser energy is high. In this respect, the method described with reference to FIG. 3 which previously forms the opening 23 in the upper protective film 9 by the photolithographic method is preferred.

Then, as shown in FIG. 4, a dicing blade 25 is prepared. The dicing blade 25 is made of a disk-shaped whetstone. The section of its edge is substantially U-shaped. The thickness of the dicing blade 25 is greater than the width of the dicing street 22 and smaller than the width of the first trench 24. This dicing blade 25 is used to cut the semiconductor wafer 21 halfway from the upper side of the semiconductor wafer 21 on the dicing street 22 and both neighboring sides, thereby forming a second straight trench 26.

Then, as shown in FIG. 5, a sealing film 15 made of an organic resin such as epoxy-based resin is formed by, for example, a screen printing method or spin coating method on the upper surface of the upper wiring line 11, on the upper surface of the columnar electrode 14, on the upper surface of the upper protective film 9, on the upper surface of the passivation film 7 exposed via the opening 23 of the upper protective film 9, and on the upper surface of the semiconductor wafer 21 exposed via the first and second trenches 24, 26 so that the thickness of this sealing film 15 is greater than the height of the columnar electrode 14. Thus, in this state, the upper surface of the columnar electrode 14 is covered with the sealing film 15.

Then, the upper side of the sealing film 15 is properly ground, such that the upper surface of the columnar electrode 14 is exposed, and the upper surface of the sealing film 15 including the exposed upper surface of the columnar electrode 14 is planarized, as shown in FIG. 6. Then, as shown in FIG. 7, a protective tape 27 is affixed onto the upper surface of the sealing film 15 including the upper surface of the columnar electrode 14.

Then, as shown in FIG. 8, the lower side of the semiconductor wafer 21 is ground with a grindstone (not shown) until at least the sealing film 15 formed in the second trench 26 is exposed. Thus, the thickness of the semiconductor wafer 21 is reduced, and the semiconductor wafer 21 is separated into the silicon substrates 1. In this state, the lower surface of the silicon substrate 1 is flush with the lower surface of the sealing film 15 formed in the second trench 26. Then, the protective tape 27 is peeled off. In addition, the protective tape 27 has only to serve as a support when the semiconductor wafer 21 is ground, and does not necessarily have to be shaped like a tape.

Then, as shown in FIG. 9, a lower protective film 18 made of an organic resin such as epoxy-based resin is formed on the lower surface of the silicon substrate 1 (semiconductor wafer 21) and on the lower surface of the sealing film 15 formed in the second trench 26. The lower protective film 18 may be formed by the application of a liquid resin using, for example, the screen printing method or spin coating method, or may be formed by affixing a support such as a resin tape.

Then, as shown in FIG. 10, the upper surface of the columnar electrode 14 is partly removed by etching to form a step 16 so that the upper surface of the columnar electrode 14 may be lower than the upper surface of the sealing film 15. Further, as shown in FIG. 11, a solder ball 17 is mounted on the upper surface of the columnar electrode 14 in and above the step 16 of the columnar electrode 14, and a thermal treatment such as reflow is carried out to join the solder ball 17 to the columnar electrode 14. Moreover, as shown in FIG. 12, the sealing film 15 and the lower protective film 18 are cut along the dicing street 22 in the center of the second trench 26, thereby obtaining a plurality of semiconductor devices shown in FIG. 1.

Now, in the step shown in FIG. 4, when the depth of the second trench 26 formed in the wafer 21 is great, the semiconductor wafer 21 might crack during the formation of the second trench 26 using the dicing blade 25. Moreover, the liquid resin for forming the sealing film 15 might not be completely filled up to the bottom of the second trench 26. Thus, an embodiment which makes it possible to solve such a problem is described next.

(Second Embodiment)

FIG. 13 shows a sectional view of a semiconductor device as a second embodiment of this invention. This semiconductor device is different from the semiconductor device shown in FIG. 1 in that the depth of a second trench 26 is smaller than that shown in FIG. 4. Therefore, the remainder of a silicon substrate 1 is formed as a projection 31 in the lower part of the peripheral side surface of the silicon substrate 1 between the lower surface of the silicon substrate 1 and the second trench 26. The side surface of this projection 31 is exposed to the outside, and the exposed side surface of this projection 31 is flush with the side surface of a sealing film 15. Further, a lower protective film 18 formed on the lower surface of the silicon substrate 1 covers the lower surface of the projection 31.

Next, one example of a method of manufacturing this semiconductor device is described. In this case, after the step shown in FIG. 3, a dicing blade 25 is used to cut a semiconductor wafer 21 halfway from the upper side of the semiconductor wafer 21 on a dicing street 22 and both neighboring sides, thereby forming a second straight trench 26, as shown in FIG. 14. In this case, the depth of the second trench 26 is smaller to some degree than that shown in FIG. 4. As a result, the semiconductor wafer 21 can be made more difficult to crack during the formation of the second trench 26 by the dicing blade 25 than in the first embodiment.

Then, an assembly shown in FIG. 15 is obtained after the sealing film forming step as shown in FIG. 5, the sealing film grinding step as shown in FIG. 6, the protective tape affixing step as shown in FIG. 7, the semiconductor wafer grinding step as shown in FIG. 8 and the protective tape peeling step. Here, in the sealing film forming step, the depth of the second trench 26 is smaller to some degree than that in the first embodiment, so that a liquid resin for forming the sealing film 15 can be completely filled up to the bottom of the second trench 26.

Moreover, in the semiconductor wafer grinding step, grinding is performed to the extent that the sealing film 15 formed in the second trench 26 is not exposed. As a result, the semiconductor wafer 21 is not separated into the silicon substrates 1, and the semiconductor wafer 21 in the part of the second trench 26 remains as a projection forming portion 31a. In this case as well, no protective tape 27 may be used from the beginning.

Then, as shown in FIG. 16, a lower protective film 18 made of an organic resin such as epoxy-based resin is formed on the lower surface of the semiconductor wafer 21 including the projection forming portion 31a. In this case as well, the lower protective film 18 may be formed by the application of a liquid resin using, for example, the screen printing method or spin coating method, or may be formed by affixing a resin tape.

Then, the upper side of a columnar electrode 14 is etched to form a step 16 in the sealing film 15 on the columnar electrode 14. Further, a solder ball 17 is formed in and above the step 16 of the sealing film 15? so that this solder ball is joined to the upper surface of the columnar electrode 14. Moreover, as shown in FIG. 17, the sealing film 15, the projection forming portion 31a of the semiconductor wafer 21, and the lower protective film 18 are cut along the dicing street 22 in the center of the second trench 26, thereby obtaining a plurality of semiconductor devices shown in FIG. 13.

Now, since the side surface of the projection 31 of the silicon substrate 1 is exposed in the semiconductor device obtained as described above, the side surface of the semiconductor device might not be protected enough under severe environmental conditions. Thus, an embodiment which makes it possible to solve such a problem is described next.

(Third Embodiment)

FIG. 18 shows a sectional view of a semiconductor device as a third embodiment of this invention. This semiconductor device is different from the semiconductor device shown in FIG. 13 in that a straight third trench 32 which exposes a sealing film 15 in the lower peripheral part of the lower surface of a silicon substrate 1 including a projection 31 is formed in order to remove the projection 31 and in that a lower protective film 18 is provided in the third trench 32.

Next, one example of a method of manufacturing this semiconductor device is described. In this case, after the step shown in FIG. 15, a dicing blade 33 is prepared as shown in FIG. 19. The dicing blade 33 is made of a disk-shaped whetstone. The section of its edge is substantially U-shaped. The thickness of the dicing blade 33 is greater than the width of a second trench 26. This dicing blade 33 is used to grind the lower side of a semiconductor wafer 21 including a projection forming portion 31a shown in FIG. 15 on the second trench 26 and both neighboring sides until a sealing film 15 is exposed. Thus, the projection forming portion 31a is removed, and a straight third trench 32 wider than the second trench 26 is formed in the lower surface of the semiconductor wafer 21.

Then, as shown in FIG. 20, a lower protective film 18 made of an organic resin such as epoxy-based resin is formed on the lower surface of the semiconductor wafer 21 including the inside of the third trench 32. In this case as well, the lower protective film 18 may be formed by the application of a liquid resin using, for example, the screen printing method or spin coating method, or may be formed by affixing a support such as a resin tape.

Then, as shown in FIG. 21, the upper side of a columnar electrode 14 is etched to form a step 16 in the sealing film 15 on the columnar electrode 14. Further, a solder ball 17 is formed in and above the step 16 of the sealing film 15 so that this solder ball is joined to the upper surface of the columnar electrode 14. Moreover, the sealing film 15 and the lower protective film 18 are cut along a dicing street 22 in the center of the second trench 26, thereby obtaining a plurality of semiconductor devices shown in FIG. 18.

In the semiconductor device obtained as described above, the straight third trench 32 is provided in the peripheral part of the lower surface of the silicon substrate 1 and under the sealing film 15 provided on the peripheral side surface of the silicon substrate 1, and the lower protective film 18 is provided in the third trench 32. Thus, the lower part of the side surface of the silicon substrate 1 can be covered with the lower protective film 18, so that the side surface of the silicon substrate 1 can be protected enough.

(Fourth Embodiment)

FIG. 22 shows a sectional view of a semiconductor device as a fourth embodiment of this invention. This semiconductor device is different from the semiconductor device shown in FIG. 18 in that the section of a third trench 32 is inclined in section gradually downward from the side surface of a sealing film 15 toward the lower surface of a silicon substrate 1 and in that a lower protective film 18 is provided in the third trench 32.

Next, one example of a method of manufacturing this semiconductor device is described. In this case, after the step shown in FIG. 15, a dicing blade 34 is prepared as shown in FIG. 23. The dicing blade 34 is made of a disk-shaped whetstone. The section of its edge is substantially V-shaped. This dicing blade 34 is used to grind the lower side of a semiconductor wafer 21 including a projection forming portion 31a shown in FIG. 15 on a second trench 26 and both neighboring sides until a sealing film 15 is exposed. Thus, the projection forming portion 31a is removed, and an inverted-V-shaped third trench 32 is formed in the lower surface of the semiconductor wafer 21 partway into the sealing film 15.

Then, as shown in FIG. 24, a lower protective film 18 made of an organic resin such as epoxy-based resin is formed on the lower surface of the semiconductor wafer 21 including the inside of the third trench 32. In this case as well, the lower protective film 18 may be formed by the application of a liquid resin using, for example, the screen printing method or spin coating method, or may be formed by affixing a support such as a resin tape.

Then, as shown in FIG. 25, the upper side of a columnar electrode 14 is etched to form a step 16 in the sealing film 15 on the columnar electrode 14. Further, a solder ball 17 is formed in and above the step 16 of the sealing film 15 so that this solder ball is joined to the upper surface of the columnar electrode 14. Moreover, the sealing film 15 and the lower protective film 18 are cut along a dicing street 22 in the center of the second trench 26, thereby obtaining a plurality of semiconductor devices shown in FIG. 22.

In the semiconductor device obtained as described above, the section of the third trench 32 is inclined in section gradually downward from the side surface of the sealing film 15 toward the lower surface of the silicon substrate 1, so that the lower part of the peripheral side surface of the silicon substrate 1 is also an inclined surface. As a result, the lower part of the peripheral side surface of the silicon substrate 1 is more resistant to cracks and the like, and safety during handling can be further improved.

(Fifth Embodiment)

FIG. 26 shows a sectional view of a semiconductor device as a fifth embodiment of this invention. This semiconductor device is different from the semiconductor device shown in FIG. 1 in that the side surface of a passivation film 7 is located inside the side surface of a low dielectric constant film/wiring line stack structure 3 and in that the side surface of the passivation film 7 is substantially flush with the side surface of an upper protective film 9.

Next, one example of a method of manufacturing this semiconductor device is described. First, as shown in FIG. 27, an assembly is prepared in which an opening 23 is formed in the upper protective film 9 and the passivation film 7 in the region of a dicing street 22 and both neighboring sides by the photolithographic method. In this state, an uppermost low dielectric constant film 4 in the region of the dicing street 22 and both neighboring sides is exposed via the opening 23.

Then, as shown in FIG. 28, a first trench 24 is formed in the four low dielectric constant films 4 in the region of the dicing street 22 and both neighboring sides within the opening 23 of the upper protective film 9 and the passivation film 7, by laser processing in which a laser beam is applied. In this case, the width of the first trench 24 is smaller than the width of the opening 23 of the upper protective film 9 and the passivation film 7. Therefore, the side surfaces of the upper protective film 9 and the passivation film 7 are located inside the side surfaces of the low dielectric constant films 4. Then, after the same steps as in the first embodiment, a plurality of semiconductor devices shown in FIG. 26 are obtained.

In this semiconductor device manufacturing method, the low dielectric constant film 4 alone is processed by the laser beam, and the passivation film 7 and the upper protective film 9 are not processed. Therefore, optimum conditions of the laser beam for processing the low dielectric constant film 4 can be set, so that the low dielectric constant film 4 can be efficiently and accurately processed.

(Sixth Embodiment)

FIG. 29 shows a sectional view of a semiconductor device as a sixth embodiment of this invention. This semiconductor device is different from the semiconductor device shown in FIG. 26 in that a passivation film 7 is smaller in size than an upper protective film 9 and in that the side surface of the passivation film 7 is located inside the side surface of an upper protective film 9.

(Another Embodiment)

In the structures in the embodiments described above, the upper wiring line 11 is formed on the upper protective film 9, and the columnar electrode 14 is formed on the connection pad portion of the upper wiring line 11. However, this invention is also applicable to a structure in which a connection pad portion is only formed on an upper protective film 9, and external connection bump electrodes such as a columnar electrode 14 and a solder ball 17 are formed on this connection pad portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate having an upper surface and a lower surface;
    a low dielectric constant film/wiring line stack structure which is provided in a region on the upper surface of the semiconductor substrate except for a peripheral part of the upper surface, and which comprises a stack of low dielectric constant films having a relative dielectric constant of 3.0 or less and wiring lines;
    an insulating film provided on the low dielectric constant film/wiring line stack structure;
    an electrode connection pad portion provided on the insulating film and connected to one of the wiring lines of the low dielectric constant film/wiring line stack structure;
    an external connection bump electrode provided on the electrode connection pad portion;
    a sealing film made of an organic resin and provided on peripheral side surfaces of the semiconductor substrate, the low dielectric constant film/wiring line stack structure, and the insulating film, and on the insulating film around the external connection bump electrode; and
    a lower protective film made of an organic resin and provided on at least the lower surface of the semiconductor substrate;
    wherein the insulating film includes a passivation film made of an inorganic material, and an upper protective film made of an organic resin and provided on the passivation film; and
    wherein a side surface of the passivation film is substantially flush with the side surface of the low dielectric constant film/wiring line stack structure, and a side surface of the upper protective film is located inward with respect to the side surface of the passivation film.

2. The semiconductor device according to claim 1, wherein a glass transition temperature of the low dielectric constant films is at least 400° C.

3. The semiconductor device according to claim 1, wherein the lower protective film is provided on the lower surface of the semiconductor substrate and on a lower surface of the sealing film provided on the peripheral side surface of the semiconductor substrate.

4. The semiconductor device according to claim 1, wherein a projection is provided on a lower part of the peripheral side surface of the semiconductor substrate, a side surface of the projection is flush with a side surface of the sealing film and exposed to the outside, and the lower protective film is provided on the lower surface of the semiconductor substrate including a lower surface of the projection.

5. The semiconductor device according to claim 1, wherein the semiconductor substrate has an upper portion located on a side of the upper surface and a lower portion located on a side of the lower surface, the peripheral side surface of the upper portion has a greater size than the peripheral side surface of the lower portion, a part of the sealing film is provided on the peripheral side surface of the upper portion, and a part of the lower protective film is provided on the peripheral side surface of the lower portion.

6. The semiconductor device according to claim 1, wherein the semiconductor substrate has an upper portion located on a side of the upper surface and a lower portion located on a side of the lower surface, the peripheral side surface of the lower portion is formed to gradually incline toward an inside of the semiconductor substrate from the peripheral side surface of the upper portion to the lower surface of the semiconductor substrate.

7. The semiconductor device according to claim 1, wherein an upper wiring line having the electrode connection pad portion is formed on the insulating film.

8. The semiconductor device according to claim 7, wherein the external connection bump electrode formed on the connection pad portion of the upper wiring line comprises a columnar electrode.

9. The semiconductor device according to claim 8, wherein a solder ball is provided on the columnar electrode.

10. The semiconductor device according to claim 1, wherein the low dielectric constant film includes any one of a polysiloxane-based material having an Si—O bond and an Si—H bond, a polysiloxane-based material having an Si—O bond and an Si—CH$_3$, bond, carbon-added silicon oxide, and a low-k material based on an organic polymer, or the low dielectric constant film includes any one of porous fluorine-added silicon oxide, boron-added silicon oxide and silicon oxide.

* * * * *